US008274068B2

(12) United States Patent
Nagashima

(10) Patent No.: US 8,274,068 B2
(45) Date of Patent: Sep. 25, 2012

(54) SEMICONDUCTOR INTEGRATED CIRCUIT DEVICE AND METHOD OF FABRICATING THE SAME

(75) Inventor: Hiroyuki Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 12/727,807

(22) Filed: Mar. 19, 2010

(65) Prior Publication Data

US 2011/0049465 A1    Mar. 3, 2011

(30) Foreign Application Priority Data

Sep. 2, 2009   (JP) ................................. 2009-202343

(51) Int. Cl.
*H01L 21/00* (2006.01)
(52) U.S. Cl. ................... 257/5; 257/2; 257/773
(58) Field of Classification Search .................. 257/2, 5, 257/773
See application file for complete search history.

(56) References Cited

U.S. PATENT DOCUMENTS

| | | | | |
|---|---|---|---|---|
| 7,335,906 B2* | 2/2008 | Toda | ................................ | 257/2 |
| 7,459,715 B2* | 12/2008 | Toda et al. | ........................ | 257/2 |
| 7,459,716 B2* | 12/2008 | Toda et al. | ........................ | 257/2 |
| 7,505,321 B2* | 3/2009 | Scheuerlein et al. | .... | 365/185.17 |
| 7,638,382 B2* | 12/2009 | Murooka et al. | ............. | 438/197 |
| 7,706,167 B2* | 4/2010 | Toda et al. | .................... | 365/148 |
| 7,729,158 B2* | 6/2010 | Toda et al. | .................... | 365/148 |
| 7,741,177 B2* | 6/2010 | Wang | ............................ | 438/257 |
| 7,745,286 B2* | 6/2010 | Wang | ............................ | 438/257 |
| 7,750,334 B2* | 7/2010 | Toda | ................................ | 257/2 |
| 7,755,934 B2* | 7/2010 | Toda et al. | .................... | 365/163 |
| 7,799,702 B1* | 9/2010 | Tanaka | ......................... | 438/758 |
| 7,855,920 B2* | 12/2010 | Ohsawa | ................... | 365/185.26 |
| 7,863,751 B2* | 1/2011 | Takase | .......................... | 257/774 |
| 7,978,499 B2* | 7/2011 | Hosono et al. | ................. | 365/148 |
| 8,008,187 B2* | 8/2011 | Dunton et al. | ................. | 438/634 |
| 8,022,381 B2* | 9/2011 | Toda | ............................ | 257/2 |
| 8,117,508 B2* | 2/2012 | Tokiwa | ......................... | 714/704 |
| 2006/0197115 A1* | 9/2006 | Toda | ................................ | 257/248 |
| 2006/0203541 A1* | 9/2006 | Toda | ............................ | 365/163 |
| 2007/0285963 A1* | 12/2007 | Toda et al. | .................... | 365/148 |
| 2007/0285964 A1* | 12/2007 | Toda et al. | .................... | 365/148 |
| 2007/0285965 A1* | 12/2007 | Toda et al. | .................... | 365/148 |
| 2007/0285970 A1* | 12/2007 | Toda et al. | .................... | 365/148 |

(Continued)

FOREIGN PATENT DOCUMENTS

JP    11-251430    9/1999

(Continued)

OTHER PUBLICATIONS

U.S. Appl. No. 13/033,026, filed Feb. 23, 2011, Nitta.

(Continued)

*Primary Examiner* — Laura Menz
(74) *Attorney, Agent, or Firm* — Oblon, Spivak, McClelland, Maier & Neustadt, L.L.P.

(57) ABSTRACT

A semiconductor integrated circuit device including: multiple wiring layers stacked on a semiconductor substrate with interlayer insulating films interposed therebetween; wiring hook-up portions extended from the corresponding wirings in the respective wiring layers; and contact conductors so buried in interlayer insulating films as to pass through the hook-up portions for vertically leading wirings of the respective wiring layers, wherein the hook-up portions have different sizes from each other between at least two layers in the wiring layers.

6 Claims, 32 Drawing Sheets

U.S. PATENT DOCUMENTS

| | | | | |
|---|---|---|---|---|
| 2007/0285971 | A1* | 12/2007 | Toda et al. | 365/148 |
| 2008/0106931 | A1* | 5/2008 | Toda | 365/163 |
| 2009/0003047 | A1* | 1/2009 | Toda | 365/163 |
| 2009/0020785 | A1* | 1/2009 | Takase | 257/211 |
| 2009/0087979 | A1* | 4/2009 | Raghuram et al. | 438/620 |
| 2009/0166682 | A1* | 7/2009 | Scheuerlein | 257/211 |
| 2009/0174032 | A1* | 7/2009 | Maejima et al. | 257/536 |
| 2009/0261315 | A1* | 10/2009 | Toda et al. | 257/5 |
| 2009/0261386 | A1* | 10/2009 | Makino | 257/210 |
| 2010/0038617 | A1* | 2/2010 | Nakajima et al. | 257/2 |
| 2010/0091551 | A1* | 4/2010 | Hosono et al. | 365/148 |
| 2010/0182853 | A1* | 7/2010 | Ohsawa | 365/189.011 |
| 2010/0237311 | A1* | 9/2010 | Okajima | 257/2 |
| 2010/0237319 | A1* | 9/2010 | Satoh et al. | 257/5 |
| 2010/0237320 | A1* | 9/2010 | Nagashima | 257/5 |
| 2010/0248422 | A1* | 9/2010 | Tanaka | 438/104 |
| 2010/0259975 | A1* | 10/2010 | Toda | 365/163 |
| 2010/0301449 | A1* | 12/2010 | Scheuerlein et al. | 257/528 |
| 2010/0322008 | A1* | 12/2010 | Yoneya et al. | 365/185.18 |
| 2011/0037046 | A1* | 2/2011 | Sato et al. | 257/4 |
| 2011/0049465 | A1* | 3/2011 | Nagashima | 257/5 |
| 2011/0066900 | A1* | 3/2011 | Tokiwa | 714/704 |
| 2011/0069524 | A1* | 3/2011 | Toba et al. | 365/63 |
| 2011/0095338 | A1* | 4/2011 | Scheuerlein et al. | 257/202 |
| 2011/0095438 | A1* | 4/2011 | Scheuerlein et al. | 257/774 |
| 2011/0116300 | A1* | 5/2011 | Maejima | 365/148 |
| 2011/0286261 | A1* | 11/2011 | Sakaguchi et al. | 365/148 |
| 2011/0305076 | A1* | 12/2011 | Toda | 365/163 |

FOREIGN PATENT DOCUMENTS

| | | |
|---|---|---|
| JP | 2006-512776 | 4/2006 |
| JP | 2008-287827 | 11/2008 |
| JP | 2009-9657 | 1/2009 |
| JP | 2009-26867 | 2/2009 |
| JP | 2009-130140 | 6/2009 |
| JP | 2010-40977 | 2/2010 |
| KR | 2001-0005983 | 1/2001 |

OTHER PUBLICATIONS

U.S. Appl. No. 13/044,973, filed Mar. 10, 2011, Nitta.

Office Action issued Jun. 21, 2011 in Korea Application No. 10-2010-24220 (With English Translation).

Office Action issued Nov. 29, 2011, in Japanese Patent Application No. 2009-202343 (with English-language translation).

\* cited by examiner (a) BL1 Hook-up Portion: 73

(b) BL2 Hook-up Portion: 73

BL Direction

BL Direction

BL Direction

SEMICONDUCTOR INTEGRATED CIRCUIT DEVICE AND METHOD OF FABRICATING THE SAME

CROSS-REFERENCE TO RELATED APPLICATION

This application is based on and claims the benefit of priority from the prior Japanese Patent Application No. 2009-202343, filed on Sep. 2, 2009, the entire contents of which are incorporated herein by reference.

BACKGROUND OF THE INVENTION

1. Field of the Invention

This invention relates to a semiconductor integrated circuit device with multi-layer wiring structure, specifically to a non-volatile semiconductor memory device with a three-dimensional (3-D) cell array structure.

2. Description of the Related Art

A resistance change memory (i.e., resistive RAM; ReRAM), in which the resistance state of cells is reversibly changed by voltage, current or heat and it serves as data, is noticed for succeeding a conventional NAND type flash memory. The ReRAM is suitable for shrinking the cell size and for constituting a cross-point, cell array, and the cell array may be easily stacked three-dimensionally (for example, refer to JPA-P2009-9657A).

Array wirings such as bit lines and word lines, which constitute multi-layered wirings in a 3-D cell array, are coupled to the underlying semiconductor substrate through vertical via-wirings at a wiring hook-up area disposed on the cell array edge. To equalize the property of the multi-layered array wirings as possible, it is in need of taking into consideration the via-contact structure (for example, refer to JPA-P2009-26867A).

Not only in an ReRAM but also in a NAND-type flash memory with NAND strings stacked vertically, multi-layered word lines are used, and it becomes necessary to hook-up the word lines to the underlying semiconductor substrate through via-contacts. A via-contact structure for hooking-up the multiple array lines stacked on a semiconductor substrate in the vertical direction (in z-direction) to the substrate, in which the array lines are inter-connected if necessary, is, for example, referred to as a "zia-contact" structure (for example, refer to JPA-P2006-512776A (PCT/US2003/041446)).

SUMMARY OF THE INVENTION

According to an aspect of the present invention, there is provided a semiconductor integrated circuit device including:
 a semiconductor substrate;
 multiple wiring layers stacked on the semiconductor substrate with interlayer insulating films interposed therebetween;
 wiring hook-up portions extended from the corresponding wirings in the respective wiring layers; and
 contact conductors so buried in the interlayer insulating films as to pass through the wiring hook-up portions for vertically leading wirings, wherein
 the wiring hook-up portions have different sizes from each other between at least two layers in the wiring layers.

According to another aspect of the present invention, there is provided a semiconductor integrated circuit device including:
 a semiconductor substrate;
 multi-layered nonvolatile memory cells stacked on the semiconductor substrate;
 multi-layered wirings disposed in association with the respective memory cells, the wirings being stacked with interlayer insulating films interposed therebetween;
 wiring hook-up portions having pairs of metal pieces, which are continued from one in the wirings to be opposed to each other with a certain space; and
 contact conductors so buried in the interlayer insulating films as to pass through the spaces of the wiring hook-up portions for vertically leading the wirings, wherein
 the pairs of metal pieces are formed to have the spaces with different widths from each other between at least two layers in the wirings.

According to still another aspect of the present invention, there is provided a method of fabricating a semiconductor integrated circuit device including:
 (a) depositing a multi-layered film including a metal layer and a memory cell layer on a semiconductor substrate;
 (b) etching the multi-layered film to form wirings elongated in a direction in such a state that the memory cell layer is patterned integrally with the wirings;
 (c) burying an interlayer insulating film between the wirings; and
 (d) repeatedly performing (a) depositing, (b) etching and (c) burying procedures under the condition that the lower layer of wirings and the upper layer of wirings are patterned to cross each other within adjacent two wiring layers, thereby forming a three-dimensional cell array, in which memory cells are remained at the cross-points of the lower layer of wirings and the upper layer of wirings;
 (e) forming wiring hook-up portions from the metal layers to be continued from the wirings in the (b) etching procedure, each wiring hook-up portion having a pair of metal pieces opposed to each other, the pairs of metal pieces being formed to have the spaces with different widths from each other between at least two wiring layers; and
 (f) burying contact conductors in the interlayer insulating films through the spaces of the wiring hook-up portions so that the respective wirings are led to the semiconductor substrate.

DETAILED DESCRIPTION OF THE EMBODIMENTS

Illustrative embodiments of this invention will be explained with reference to the accompanying drawings below.

In the embodiments described below, a ReRAM will be explained as a nonvolatile memory device. However, the present invention is not limited to it, but adaptable for other nonvolatile memory devices such as a phase change RAM (i.e., PCRAM), a NAND flash memory with vertical-stacked NAND strings and the like, in which a zia-contact structure is used for hooking-up multi-layered wirings to the underlying semiconductor substrate.

Further, in the ReRAM, a memory cell is formed of a variable resistance element and a non-ohmic selection device connected in series. It is adaptable not only a 1T1R type of memory cell, in which one transistor is used as the selection device, but also a 1D1R type of memory cell, in which one diode is used as the selection device.

[ReRAM Construction]

Figure 1:
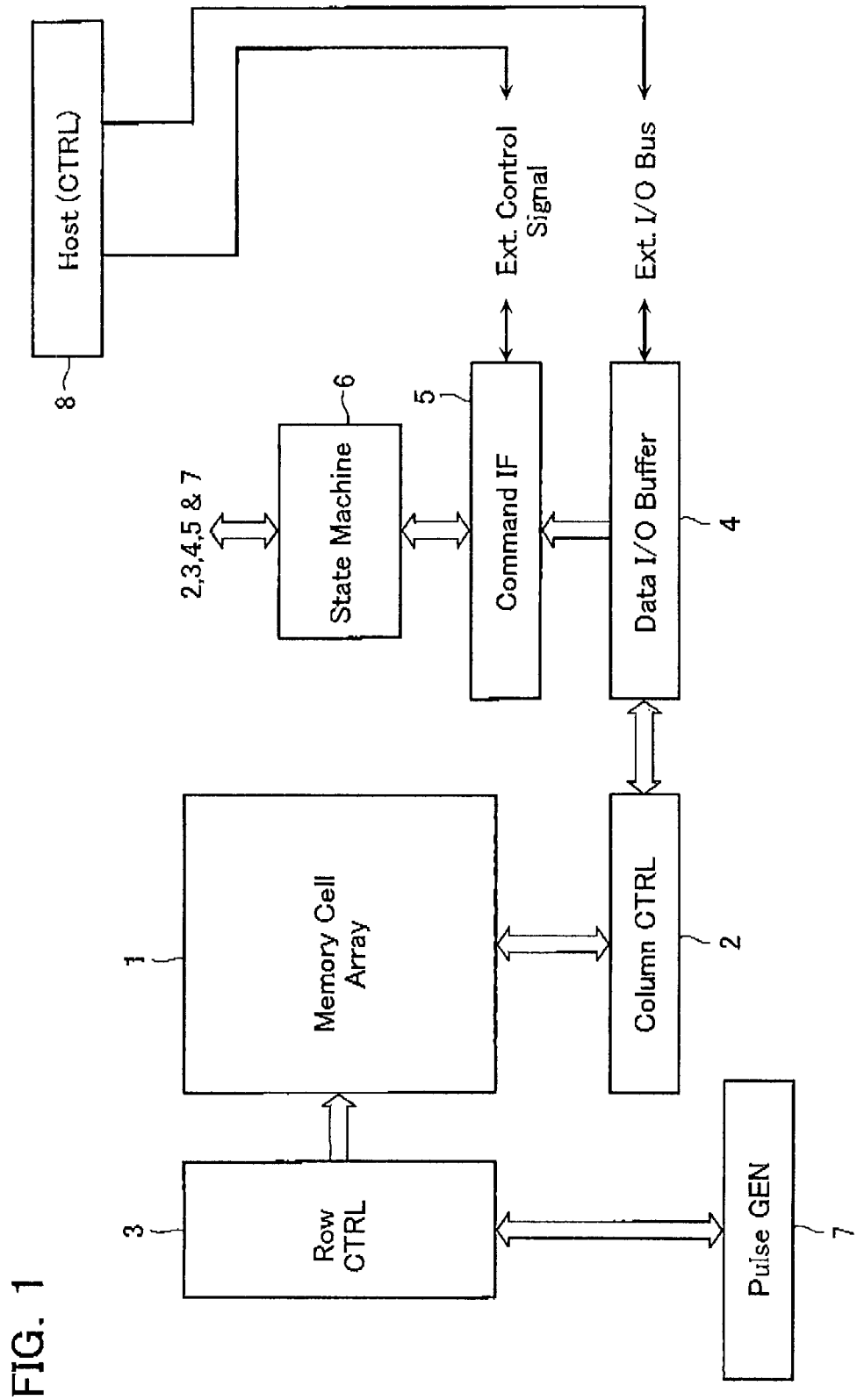
FIG. 1 shows a block configuration of a ReRAM in accordance with an embodiment.
Figure 2:
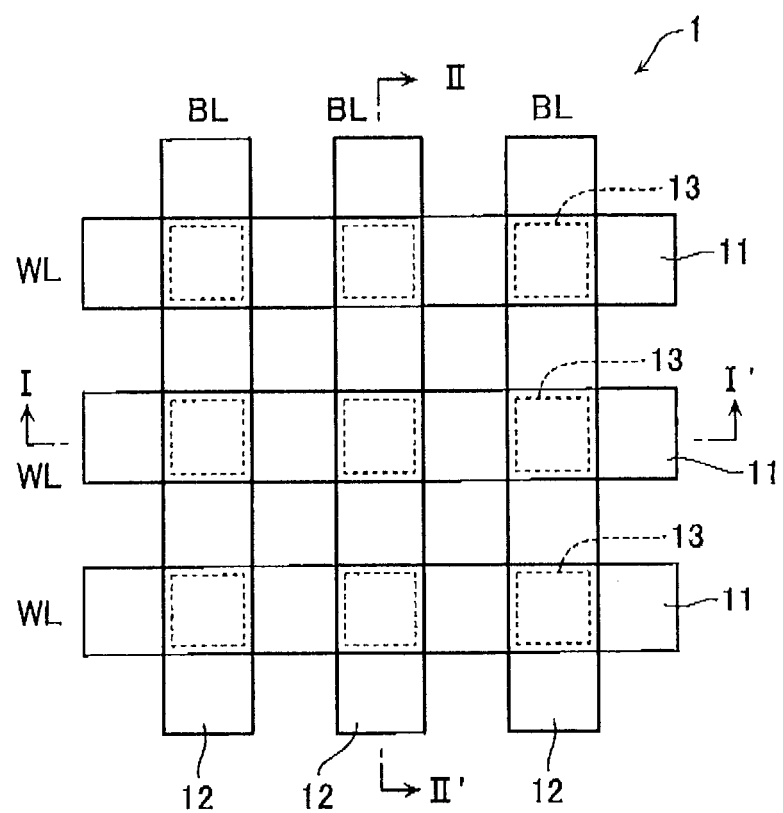
FIG. 2 shows a 3-D cell array layout of the ReRAM.
Figure 3:
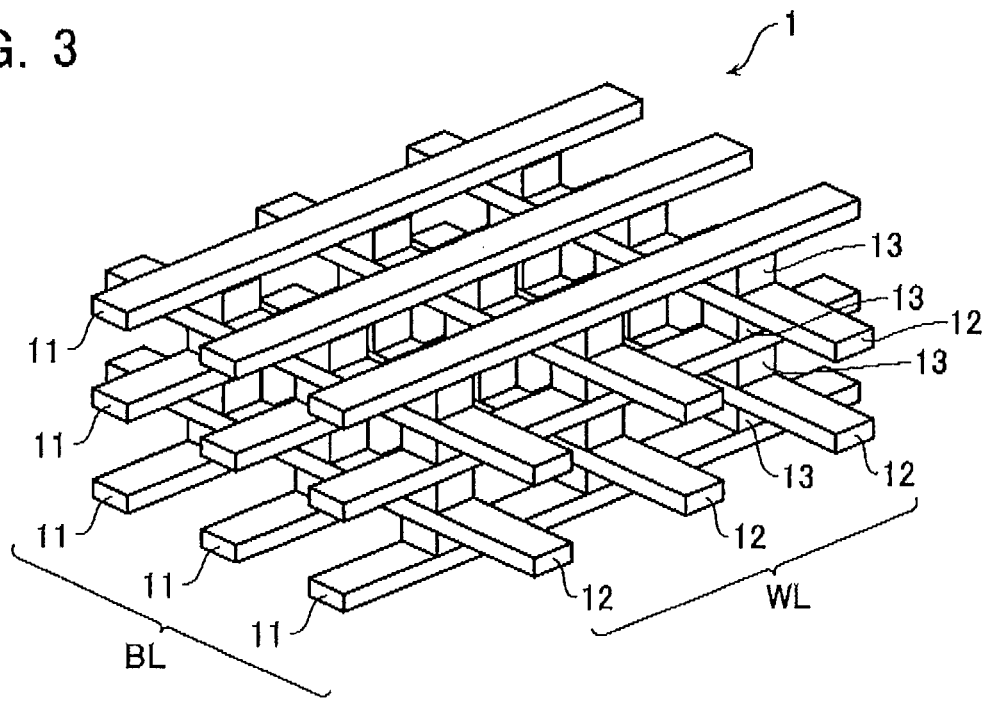
FIG. 3 is a perspective view of the 3-D cell array structure.

FIG. 2 shows a functional block of a ReRAM in accordance with an embodiment. Memory cell array 1 is, as shown in the plan view of FIG. 2 and the perspective view of FIG. 3, a cross-point type of cell array. Memory cells 13 are disposed at the respective cross points of word lines(WL) 11 and bit lines(BL) 12 arranged to cross each other. In the example shown in FIG. 3, the cell array 1 is formed as a three-dimensionally stacked cell array (i.e., 3-D cell array) with four layers.

Column control circuit 2 and row control circuit 3 are prepared for controlling the bit lines and word lines, respectively, in the memory cell array 1 for erasing, writing and reading data. In case the memory cell array is formed to have multiple blocks (or mats or sectors), the column control circuit 2 and row control circuit 3 may be disposed for the respective blocks, or shared by the multiple blocks. Alternatively, the column control circuit 2 and row control circuit 3 may be disposed for the respective cell array layers, or shared by the multiple cell array layers.

In case the memory cell array is formed of multiple blocks, word lines may be formed of local word lines disposed in the respective blocks and global word lines disposed in common to the multiple blocks. Bit lines may also be formed to have a hierarchic structure of local bit lines and global bit lines.

Memory cell array 1 reciprocates data for the external host 9 via data input/output buffer 4 and external I/O lines. Data input/output buffer 4 serves as follows: receiving write data; receiving an erase-instruction; outputting read data; and receiving command and address data. Received write data is loaded in the column control circuit 2, and serves for write-controlling the cell array 1. Read data read from the cell array 1 is latched in the column control circuit 2, and then output to the external via the data I/O buffer 4.

Address data is input to state machine 6 via the data I/O buffer 4 and then transferred to column control circuit 2 and row control circuit 3. Command data supplied from host 8 is input to command interface 5 via data I/O buffer 4.

Command interface 5 receives a control signal supplied from host 8 to judge whether the input data in the data I/O buffer 4 is command data or address data. If the input data is command data, it is decoded as a command signal to be transferred to state machine 6.

State machine 6 manages the whole ReRAM. In detail, state machine 6 is for controlling the following operations: receiving command data; reading, writing and erasing data; managing data input/output; and the like.

Further, host 8 is also possible to receive the status information generated from the state machine 6, and judge the operation result. This status information will be used for controlling data write and erase.

Pulse generator 7 generates a control pulse with optional voltage at an optional timing under the control of state machine 6. This control pulse is transferred to a word line selected by row control circuit 3 as a write pulse, read pulse or the like.

Peripheral circuit devices disposed around the memory cell array 1 are formed on the semiconductor substrate underlying the memory cell array 1 stacked thereabove. Therefore, the chip area of this nonvolatile memory device may be made to be substantially equal to that of memory cell array 1.

Figure 4:
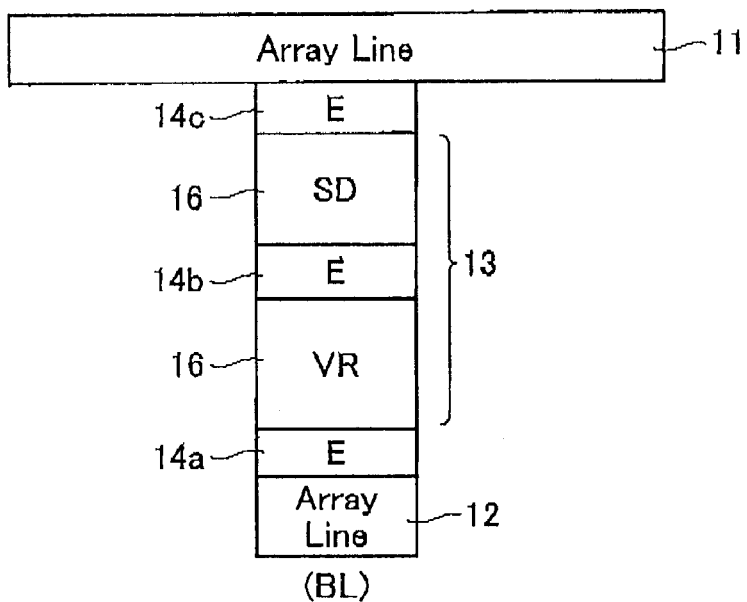
FIG. 4 is a sectional view of the unit cell of the 3-D cell array.

FIG. 4 shows a sectional view of a unit cell portion of the cross-point type of memory cell array 1. The cross-point structure is referred to as such a structure that memory cell 13 is disposed at the cross-point of a word line(WL) 11 and a bit line(BL) 12. Array wirings such as word line 11 and bit line 12 are low-resistive and heat-resistant metal wirings formed of tungsten (W), tungsten silicide (WSi), nickel silicide (NiSi), cobalt silicide (CoSi) and the like. Memory cell 13 is formed of variable resistance element VR, the resistance value of which is variably set with voltage, current, heat or chemical energy, and selection element SD stacked with electrode 14b interposed therebetween.

There are also disposed electrodes 14a and 14c between variable resistance element VR and bit line 12, and between selection element SD and word line 11, respectively. These electrodes 14a to 14c each serve, if necessary, as adhesive or barrier metal. Therefore, electrodes 14a to 14c are formed of Pt, Au, Ag, TiAlN, SrRuo, Ru, RuN, Ir, Co, Ti, TiN, TaN, LaNiO, Al, PtIrOx, PtRhOx, Rh, TaAlN and other metal material.

It is effective to insert a metal layer for making the variable resistance element uniformly crystal-oriented. Further, it is useful to insert a buffer layer, a barrier metal layer and an adhesive layer independently of the electrodes.

In this embodiment, plural memory cell layers described above are stacked in such a manner that adjacent two cell arrays share array wirings to have a wiring/memory cell/ wiring/memory cell/wiring structure. In this case, it is also adaptable that adjacent two cell arrays are isolated from each other with an interlayer dielectric film and to constitute a layer-repeated structure formed as follows: wiring/cell/wiring/insulator/wiring/cell/wiring.

The former cell array structure is useful for obtaining merits such as: the number of layers is small; and the cost is low. However, as a result of the number of cells shared by a wiring becomes large, there may be generated a few demerits on the reliability such as: performance deterioration; and disturbances on non-selected cells.

By contrast, in the latter cell array structure, the number of wiring layers becomes large, and the cost becomes high while a high speed performance and high reliability will be achieved because the number of cells coupled to a wiring is reduced to a half in comparison with the former case.

Figure 5:
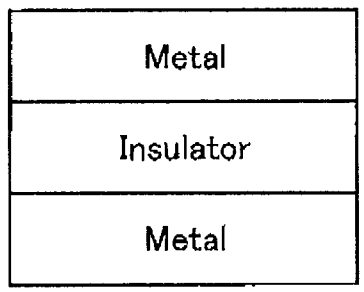
FIG. 5 shows an MIM device as a selection device.
Figure 6:
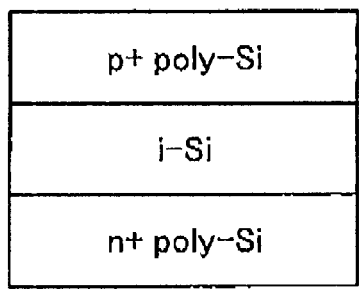
FIG. 6 shows a PIN diode as a selection device.

Used as the non-ohmic selection element SD are many kinds of diodes such as a PN junction diode, a PIN diode (shown in FIG. 6), a Shottkey diode and the like, an MIM (Metal-Insulator-Metal) device (shown in FIG. 5) and an SIS (Silicon-Insulator-Silicon) device. It is useful to insert a barrier metal layer or an adhesive layer within these devices.

To make the ReRAM unipolar-operable, it is desired to use a diode as the non-ohmic device. By contrast, to make the ReRAM bipolar-operable, it is desired to use an MIM device or an SIS device.

Figure 7:
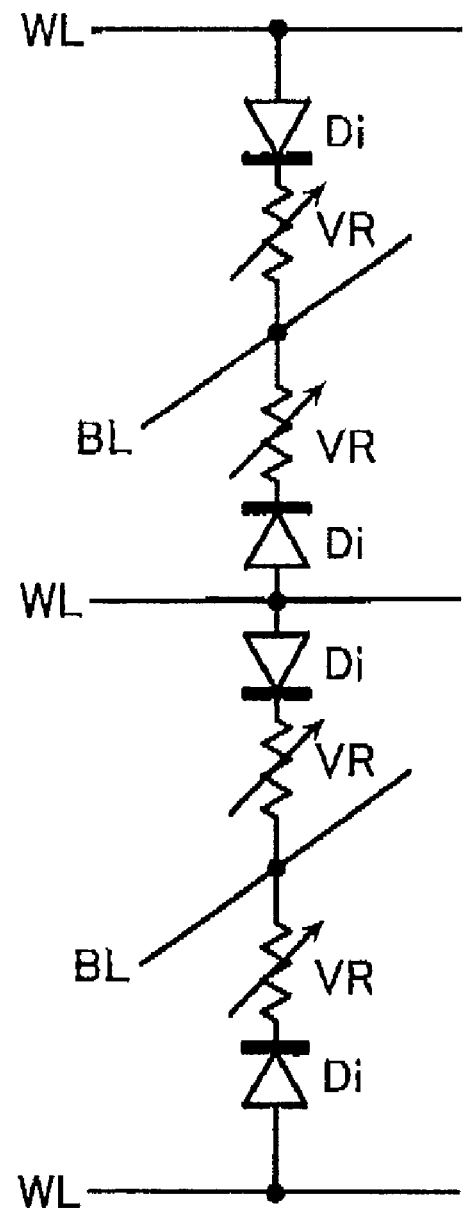
FIG. 7 shows an equivalent circuit of the cell array stacked structure.

FIG. 7 shows an equivalent circuit of the four-layered cell array, in which diode Di is used as the non-ohmic selection device SD. The arrangement of diode Di and variable resistance element VR becomes a mirror image, in which word line WL or bit line BL are centered. However, the cell arrangement is not limited to that described above. That is, suitably setting the bias relationship between bit line BL and word line WL, other cell arrangements may be adaptable.

[3-D Cell Array Structure and Fabrication Process Thereof]

Next, a detailed structure of a 3-D cell array and fabrication process thereof will be explained below.

Figure 8:
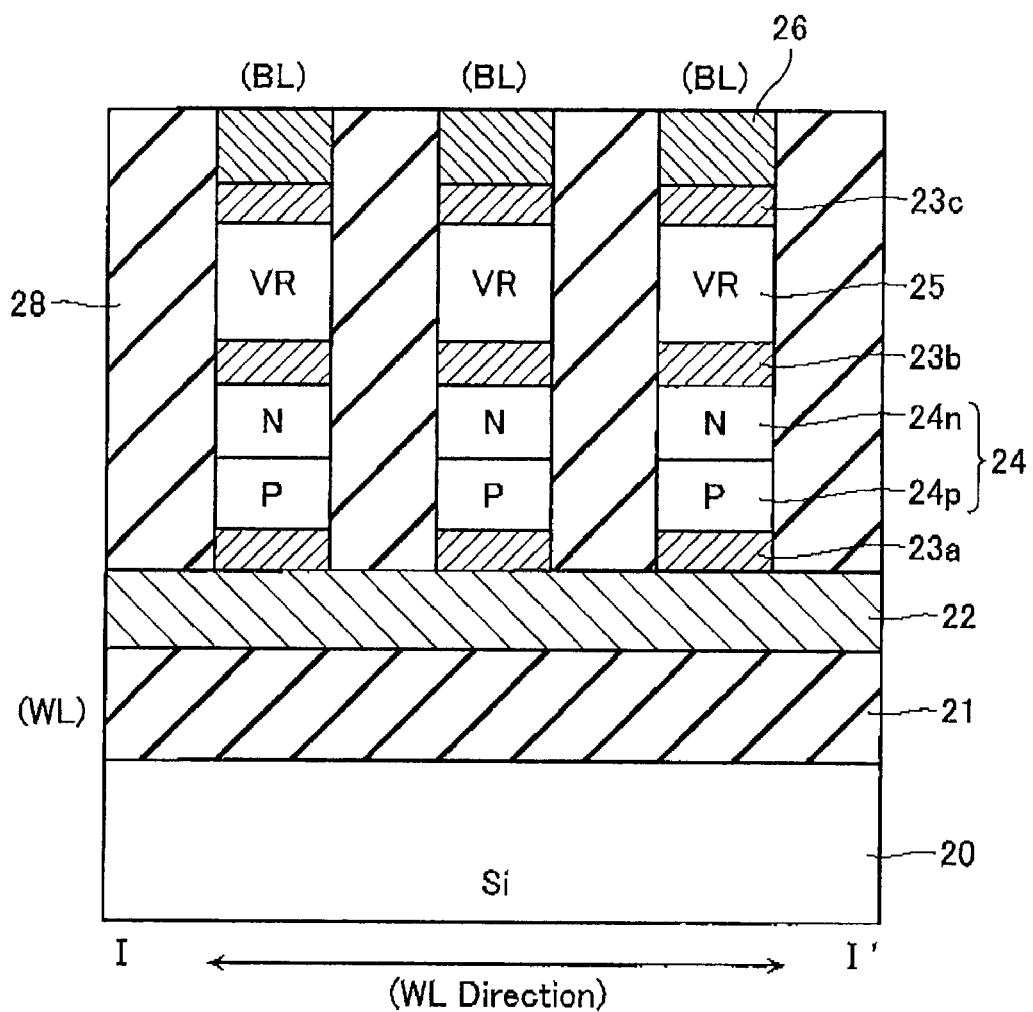
FIG. 8 shows I-I' sectional view of the 3-D cell array shown in FIG. 2.
Figure 9:
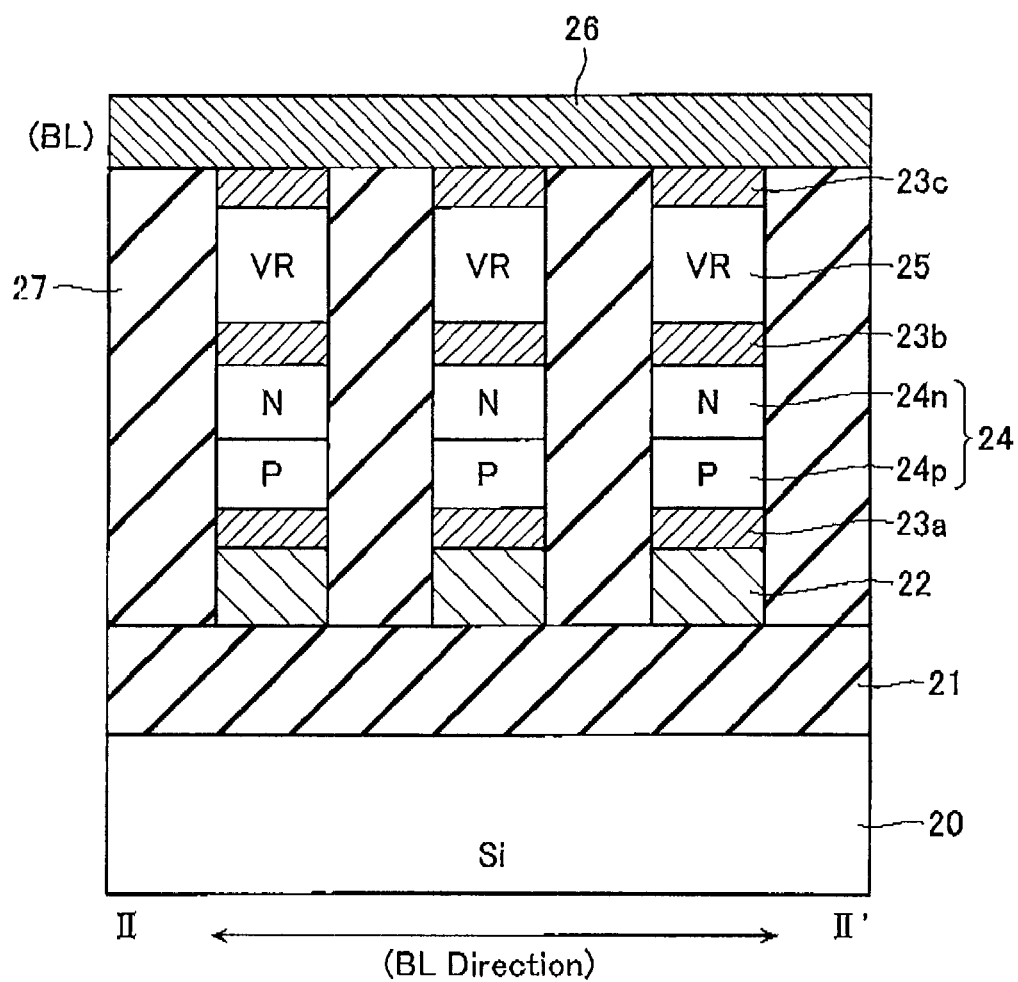
FIG. 9 shows sectional view of the 3-D cell array shown in FIG. 2.

FIGS. 8 and 9 shows sectional views of the memory cell array (only for the lowermost and basic cell array layer) taken along word line (WL) direction and bit line (BL) direction (i.e., I-I' and II-II' sectional views), respectively. Silicon substrate 20 is covered with interlayer dielectric film 21, on which the cell array is stacked. The silicon substrate 20 is referred to as an FEOL (Front End Of Line) substrate, in which circuit forming processes prior to the cell array stacking has been completed.

Figure 10:
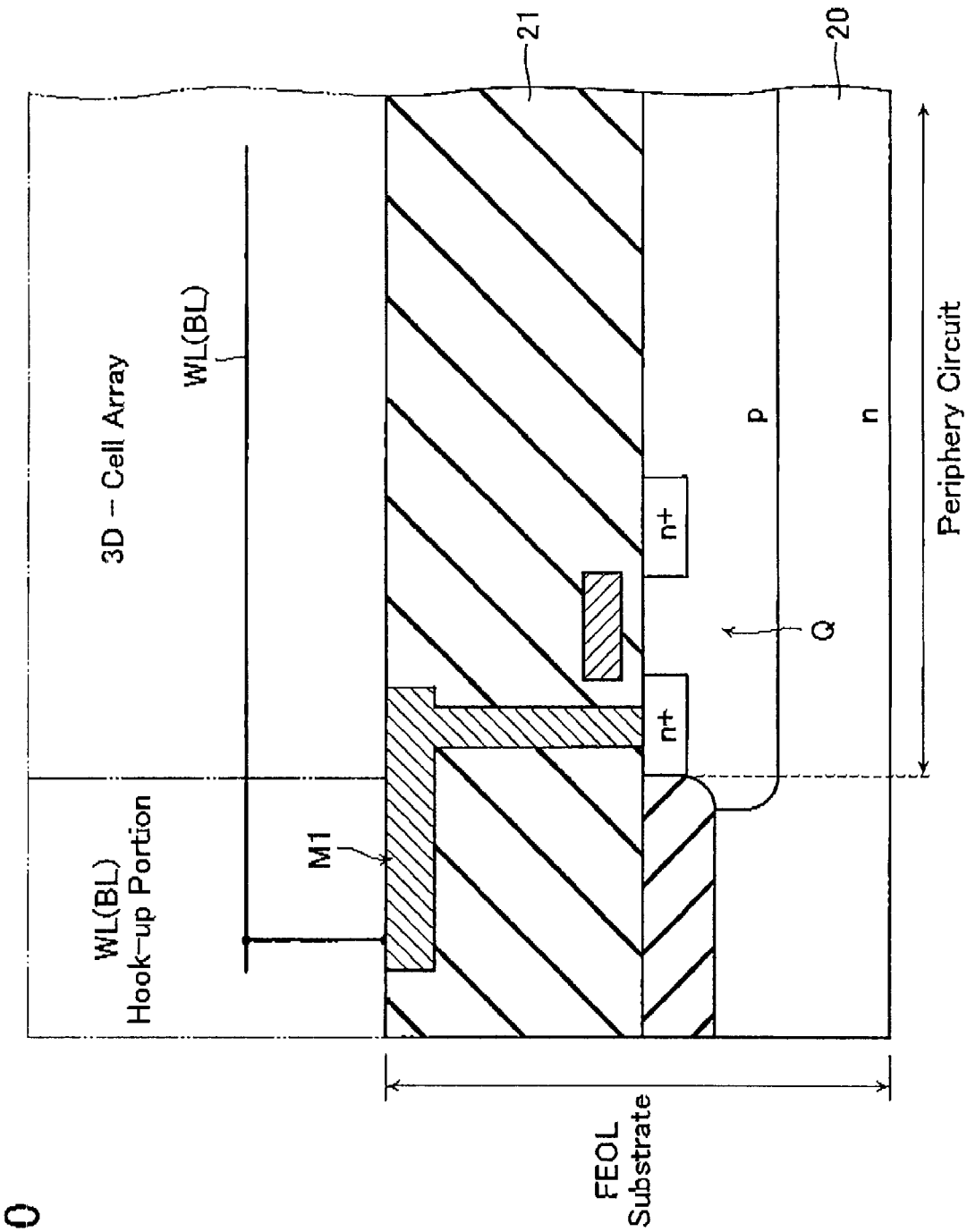
FIG. 10 shows an FEOL substrate on which cell arrays are stacked.

Explaining in detail, the FEOL substrate is, as shown in FIG. 10, a silicon substrate 20 with interlayer insulating film 21 covered. A peripheral circuit including circuit devices, such as transistors, has been formed on an area of the substrate 20, on which the cell array is to be stacked. On or in the interlayer dielectric film 21, al least one metal wiring layer (plural layers, if necessary) has been formed. In FIG. 10, a typical one metal wiring M1 is shown. Metal wiring M1 is connected with a circuit device, for example, source or drain layer of transistor Q.

Array wirings in the stacked cell arrays, i.e., word lines WL and bit lines BL, are connected with metal wirings M1 on the FEOL substrate in a wiring hook-up area, and coupled to the periphery circuit.

In FIGS. 8 and 9, transistors and metal wirings on the FEOL substrate are not shown. As shown in FIGS. 8 and 9, firstly formed on the interlayer dielectric film are the first metal wirings serving as word lines (WL) 22, which are formed of a low resistive metal film such as a tungsten(W) film.

On the word lines 22, diodes (Di) 24 serving as selection devices SD and variable resistance elements (VR) 25 are stacked and patterned to be arranged at a certain pitch. Formed on the variable resistance elements 25 are the second metal wirings serving as bit lines (BL), to which the variable resistance elements arranged to cross the word lines 22 are coupled in common.

In this case shown here, diode 24 is a PN diode formed of P-type of poly-silicon film 24p and N-type of poly-silicon film 24n. Alternatively, not only a PIN diode or a Shottkey diode but also an MIM device or an SIS device may be used as the non-ohmic device.

Between diode 24 and word line 22, Ti or TiN barrier metal 23a is formed. Disposed on the lower surface and the upper surface of variable resistance element 25 are electrodes 23b and 23c, which may be attached with barrier layers or adhesive layers. Alternatively, these electrodes may be formed of one metal film serving as a barrier metal or an adhesive layer.

Buried around the memory cells are interlayer insulating films 27 and 28, and word lines 22 and bit lines 26 are isolated with these interlayer insulating films 27 and 28.

Although FIGS. 8 and 9 show only the lowermost and basic cell array layer, the same cell array as described above is repeatedly stacked. In this case, plural cells may be stacked with interlayer insulating films interposed therebetween. Alternatively, memory cells may be stacked without interlayer insulating films, or memory cell arrays may be stacked in such a manner that common word lines or common bit lines are sandwiched between adjacent cell arrays.

[Method of Fabricating 3-D Cell Array (Part 1)]

Next, a method of fabricating the 3-D cell array (part-1) will be explained below with reference to FIG. 11. In this fabrication process, an array wiring metal layer and a memory cell layer are stacked, and the whole layers are patterned to word lines or bit lines. That is, the metal layer is patterned to word lines or bit lines in such a state that it is covered with the memory cell layer. Repeating this process, memory cells are self-aligned at the respective cross-points of the word lines and bit lines crossing each other.

Figure 11:
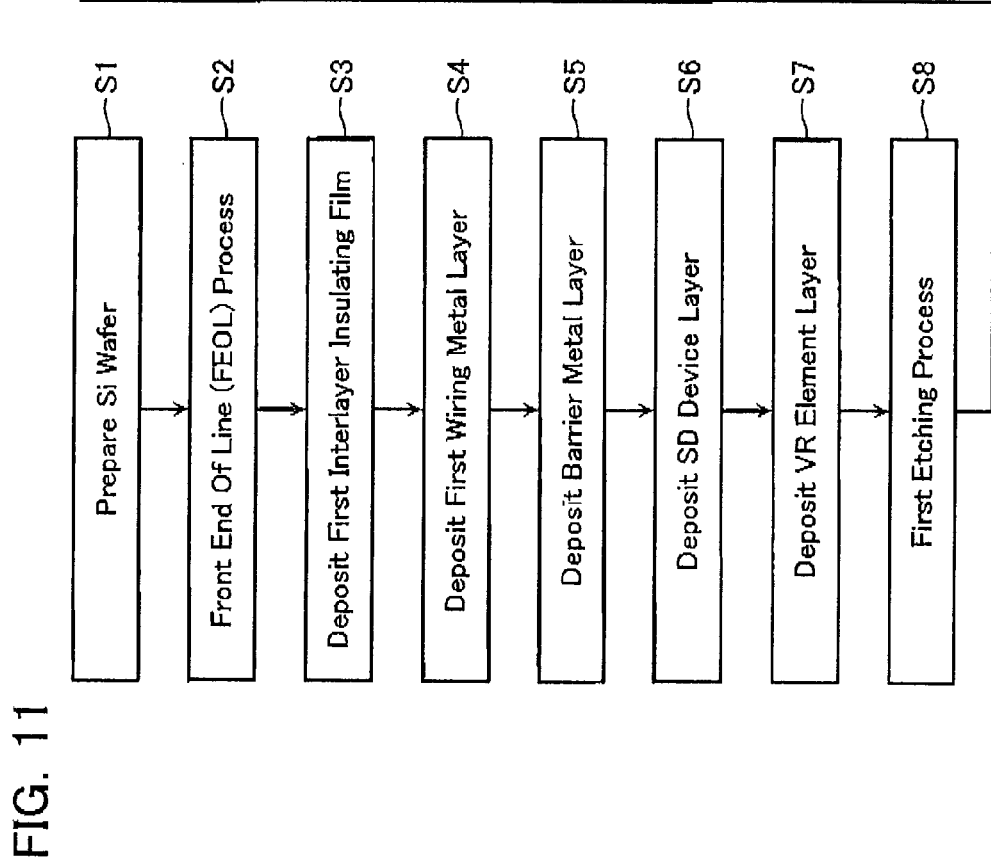
FIG. 11 is a process flow for explaining the fabrication process of the ReRAM.

As shown in FIG. 11, prepare silicon substrate 20 (step S1); perform FEOL process for this substrate to form the peripheral circuit of the cell array (step S2); and deposit interlayer insulating film 21 (step S3). Formed on or in this interlayer insulating film 21 are at least one layer of metal wirings, which serve for coupling the word lines or bit lines to be formed later to the substrate.

Sequentially deposited on the FEOL substrate obtained as explained above are as follows: a first metal layer, which serves as word lines 22 of the cell array (step S4); a barrier metal layer, for example, Ti/TiN layer (step S5); non-ohmic device (SD) layer (step S6); and variable resistance element (VR) layer (step S7). Although not shown in FIG. 11, electrode layers are formed on the lower surface and the upper surface of the variable resistance element layer.

Figure 12:
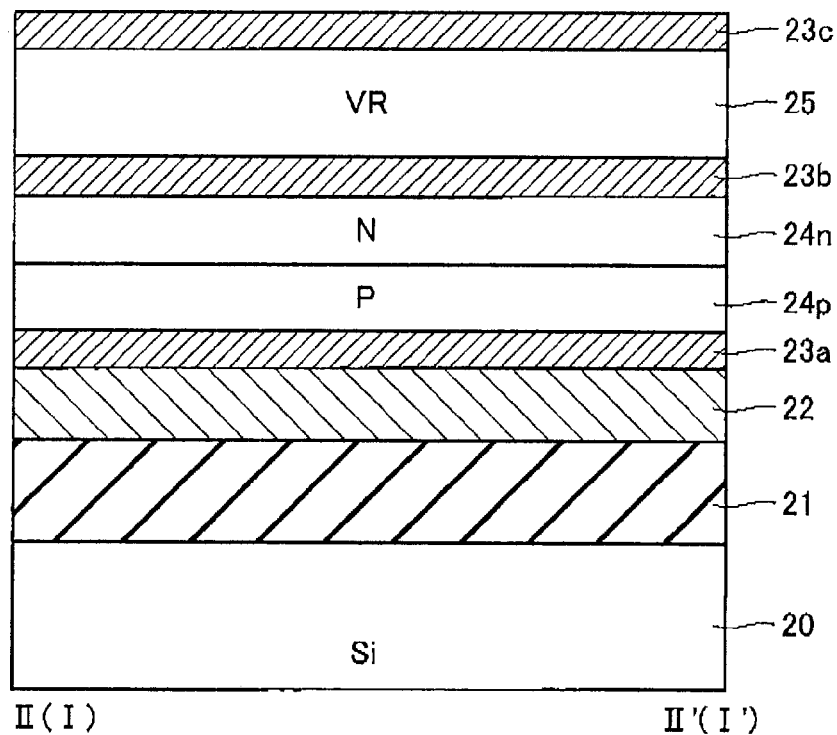
FIG. 12 is a sectional view of the first cell array stacked structure.

The multi-layer stacked structure after the above-described deposition processing is shown in FIG. 12. I-I' and II-II' sectional views are the same as each other.

In case the non-ohmic device SD is poly-silicon diode, P-type poly-silicon layer 24p and N-type poly-silicon layer 24n are sequentially formed. Specifically, adapting an in-situ deposition method, in which the P-type layer and N-type layer are formed in one poly-silicon deposition process, the process becomes simple.

Figure 13:
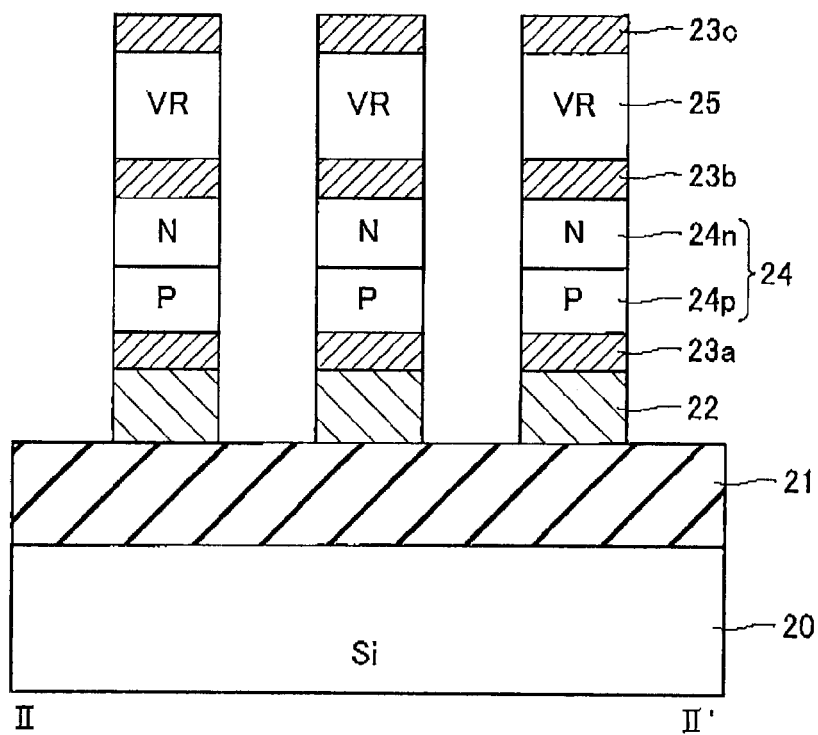
FIG. 13 is a II-II' sectional showing the L/S processing of word lines.

Next, the multi-layer stacked structure described above is subjected to a first etching process for patterning the first metal layer to word lines (step S8). Explaining in detail, by use of a reactive ion etching (RIE) method, the memory cell layer is etched with line(L)/space(S)=F/F (where, "F" is minimum feature device size) until when the interlayer insulating film 21 on the FEOL substrate is exposed. FIG. 13 shows the II-II' sectional view after this process. Word lines 22 are formed in such a manner that the memory cell layers are remained on the entire surfaces of the word lines 22.

Figure 14:
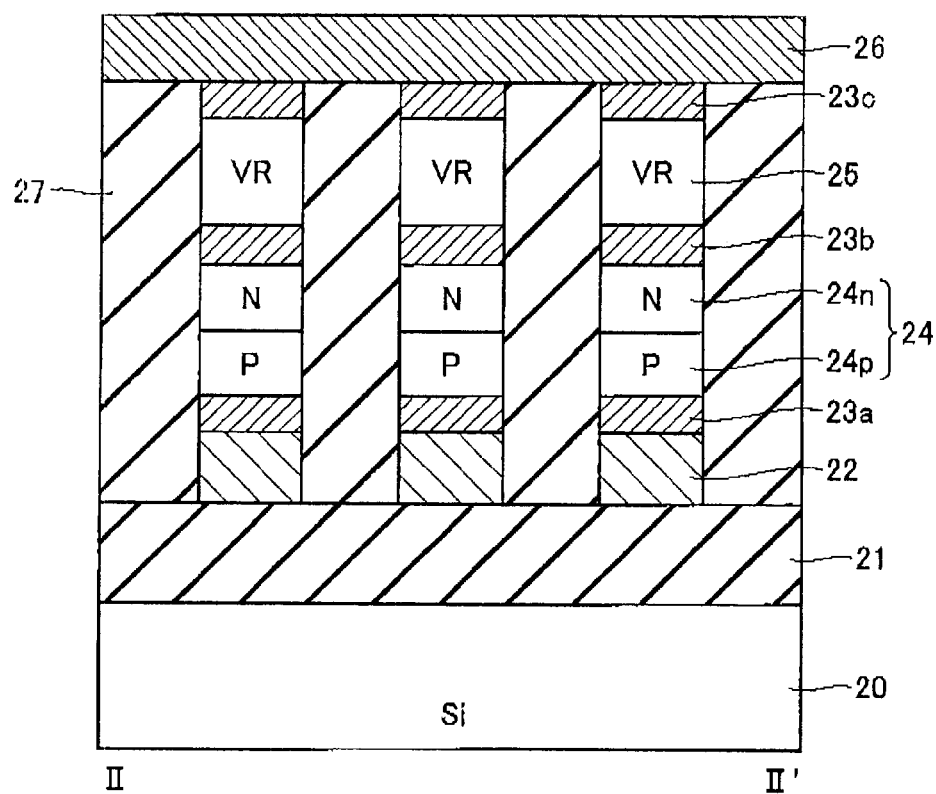
FIG. 14 is a II-II' sectional view showing the state, in which the interlayer insulating film is deposited and the metal wiring layer is formed.

Next, deposit the second interlayer insulating film 27 with a HDP(High Density Plazma)-CVD method (step S9); planarize it with a CMP (Chemical Mechanical Polishing) method to expose electrode 23c (step S10); and deposit a second wiring metal layer serving as bit lines 26 (step S11). That is, as shown in FIG. 14, space portions between word lines 22 are buried with interlayer insulating film 27 in such a manner that electrodes 23c are exposed, and then the second wiring metal layer are deposited.

It is desirable that the interlayer insulating film 27 has a good insulating property, a low capacitance, and a good step-coverage property. Therefore, the insulating film 27 is formed of, for example, a BPSG film. In case a hard mask is used in the L/S process, it becomes necessary to remove the hard mask after the planarizing process.

Figure 15:
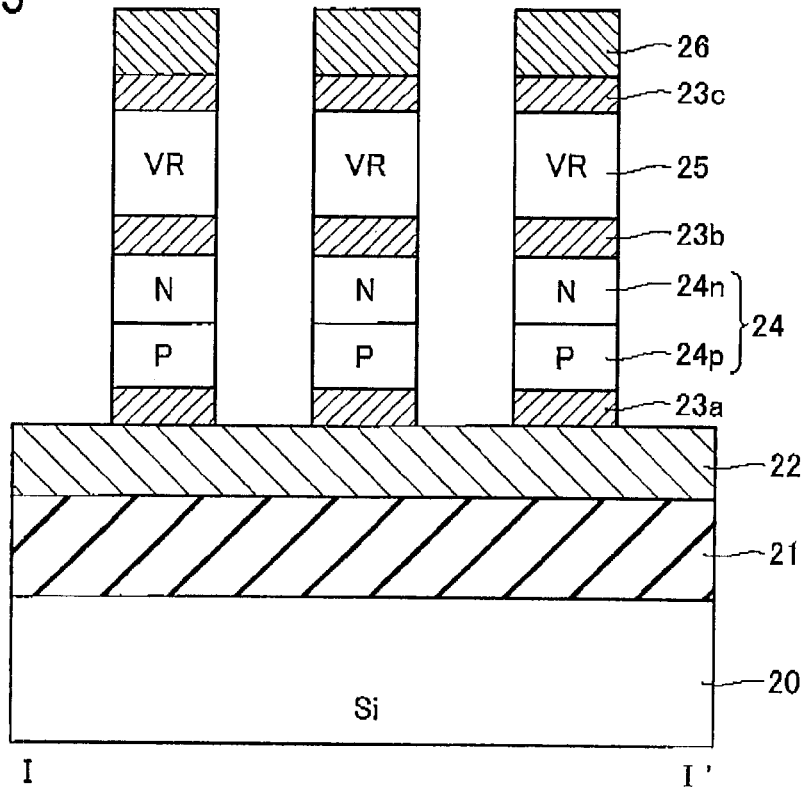
FIG. 15 is I-I' sectional view showing the L/S processing of bit lines.

Thereafter, the second etching process is performed for patterning the second wiring metal layer to bit lines (BL) 26 crossing the word lines 22 (step S12). This etching process is also performed with an RIE method and L/S=F/F. In this etching process, word lines 22 serves as an etching stopper. As a result, I-I' sectional view shown in FIG. 15 will be obtained. That is, bit lines 26 are formed, and simultaneously with it, the memory cell layers deposited continuously on the word lines 22 are patterned to individual memory cells, which are remained at the respective cross points between word lines 22 and bit lines 26.

Figure 16:
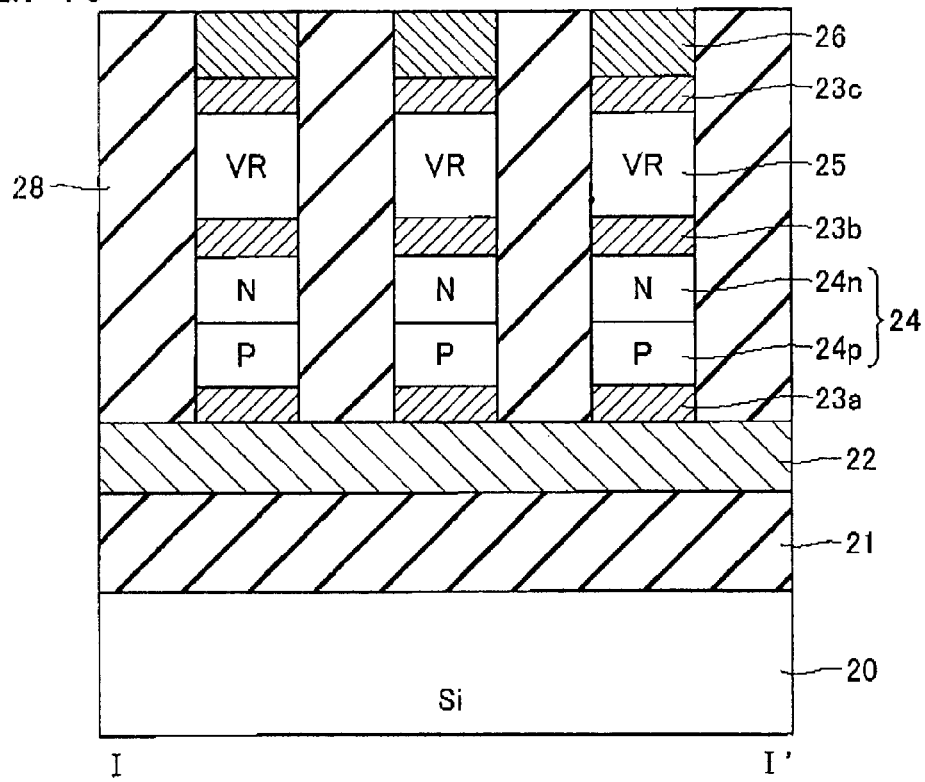
FIG. 16 is a I-I' sectional view showing the state, in which the interlayer insulating film is deposited and planarized.

Next, as shown in FIG. 16, the third interlayer insulating film 28 is deposited with an HDP-CVD method to be buried in the space portions between bit lines 26 (step S13), and then planarize it with CMP process (step S14). So far, a cross-point type of basic cell array is obtained.

With the multi-layer deposition processes and two L/S patterning processes, the memory cell layer is self-aligned to the word lines and bit lines, whereby memory cells are remained only at the respective cross-pints between the word lines and bit lines. In the fabrication process in accordance with this embodiment, there is no alignment error between memory cells and word lines and bit lines. By contrast, there are generated alignment errors in a wiring hook-up area for hooking-up the word lines and bit lines, which will be explained later together with the solution method.

Thereafter, repeatedly performing from the barrier metal deposition to the third interlayer insulating film deposition and planarization (i.e., from step S5 to step S14) (step S15), the 3-D cell array is obtained. If the barrier metal deposition is performed in a state that bit lines 26 are exposed, upper and lower adjacent two cell arrays share the bit lines. Similarly, if the barrier metal deposition is performed in a state that word liens 22 are exposed, adjacent two cell arrays share the word lines.

It is possible to form such a state that the upper and lower adjacent two cell arrays are isolated from each other with an interlayer insulating film interposed therebetween. The merits and demerits have already been explained above. After fabricating the 3-D cell array, other metal wirings such as global word lines and/or global bit lines are formed (step S16).

To make the memory cell in the 3-D cell array optimal and stable, other processes may be adapted additionally to the above-described process. For example, variable resistance element VR is formed of, for example, a binary metal oxide. Therefore, it is preferable to perform an additional process for the variable resistance element VR for obtaining optimal and stabilized cell properties.

For example, it will be explained a case where binary metal oxide such as NiO, TiO, WO and the like is used as the variable resistance element VR. If oxidizing it, the resistance value increases. By contrast, if reducing it, the resistance value decreases. Therefore, adding oxidizing or reducing process to the variable resistance element layer, for example, the resistance value Rset in a set state may be made to be optimal.

Further, forming a passivation film on the side surface of the memory cell including the variable resistance element, data retention thereof will be improved. As the passivation film, an oxide film or a nitride film may be used.

Figure 17:
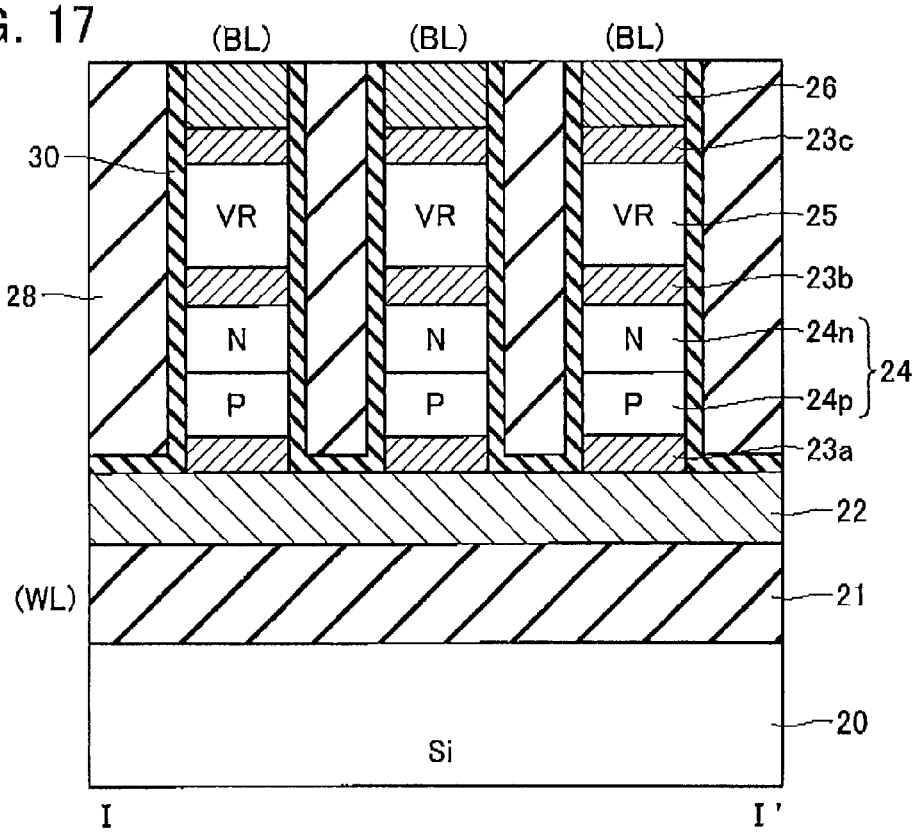
FIG. 17 is a I-I' sectional view showing the state, in which the passivation film is formed on the side surface of the memory cell.
Figure 18:
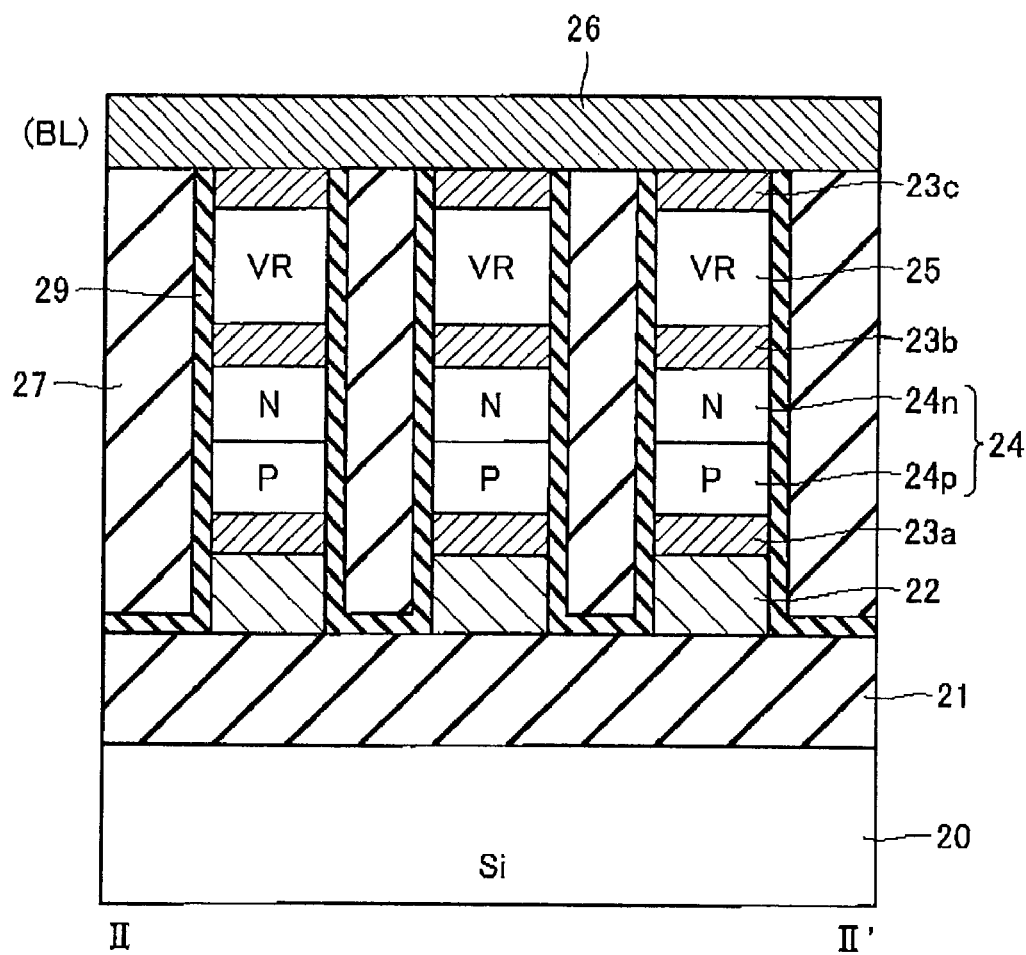
FIG. 18 is a II-II' sectional view showing the state, in which the passivation film is formed on the side surface of the memory cell.

FIGS. 17 and 18 show the states of memory cell including variable resistance element (VR) 25 and diode (Di) 24 in correspondence to the sectional views shown in FIGS. 8 and 9, respectively. The side surface of the memory cell is covered with passivation films 29 and 30.

Figure 19:
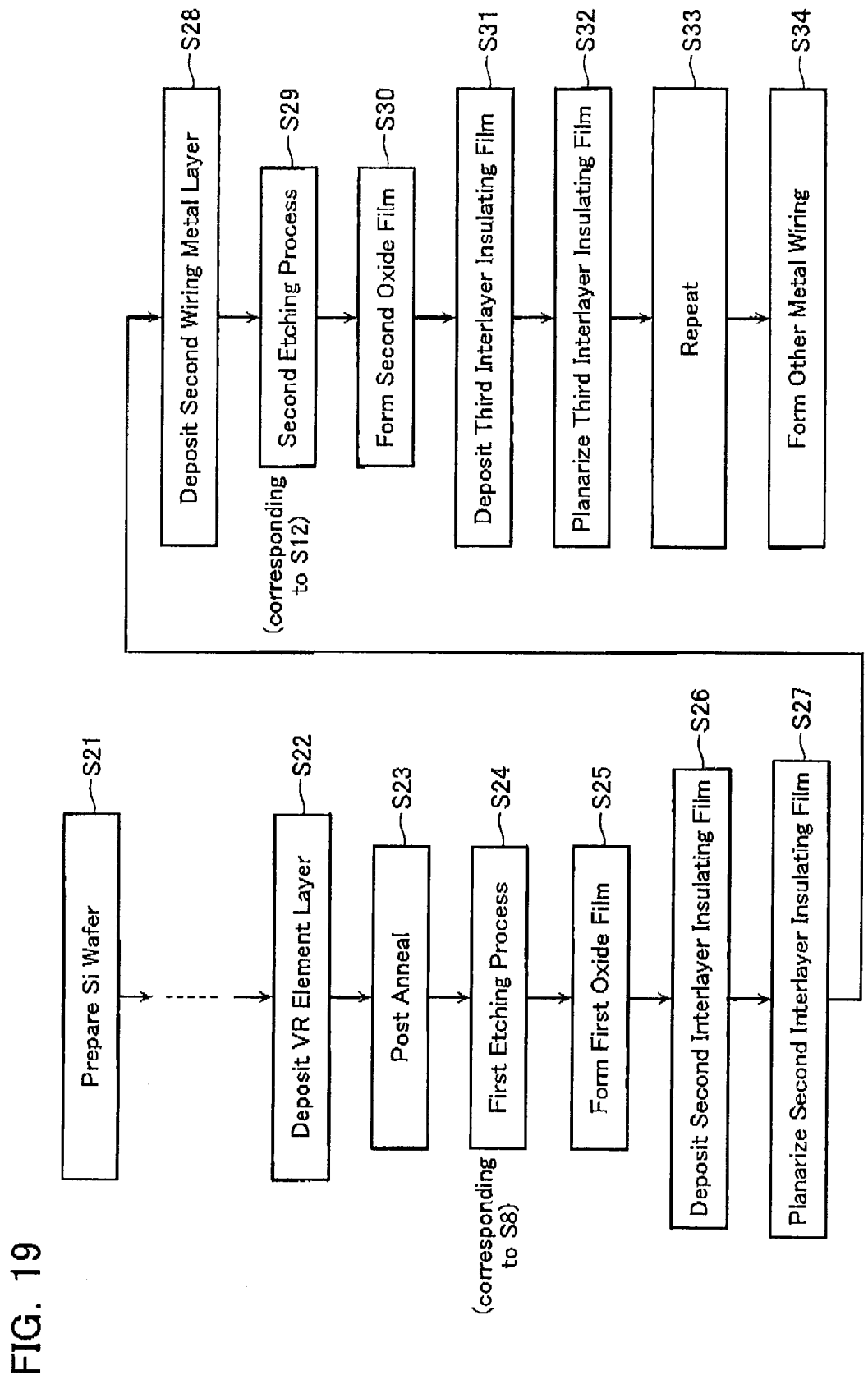
FIG. 19 shows a process flow, in which post anneal process and oxide forming process are added to that shown in FIG. 11.

FIG. 19 shows a process flow, in which with respect to the variable resistance element VR, a post anneal step and an oxide film forming step are added to that shown in FIG. 11.

The process from step S21 (preparing the silicon substrate) to step S22 (depositing the variable resistance element layer) is not different from that in accordance with steps S1 to S7 shown in FIG. 11. After depositing necessary variable resistance element films, change the temperature and gas atmosphere in the presently used deposition apparatus, and perform post anneal process for the variable resistance element films (step S23).

Adding this post annealing process, the resistance value of the variable resistance element film, i.e., set resistance Rset of the variable resistance element VR, may be made to be optimal. For example, the post annealing process in Ar gas atmosphere becomes reducing process useful for lowering the resistance value of the variable resistance element. Further, this post anneal process brings another effect for forwarding the crystallization of the variable resistance element film, i.e., improving the film properties.

The post annealing condition, i.e., temperature and gas atmosphere, may be suitably set or changed. Further, the post anneal may be performed for multiple memory cell layers as a whole after the multiple memory cell layers have been stacked.

Next, first etching process is performed for forming the word line pattern correspondingly to the step S8 (step S24). As a result of this process, the side wall of the variable resistance element film is exposed. In this state, first oxide film forming process is performed for forming an oxide film as a passivation film on the side wall of the variable resistance element film (step S25).

The oxide film forming process described above is in accordance with ISSG (In-situ Stream Generation), RTA (Rapid Thermal Anneal), HTO (High Temperature Oxidization) and the like. With this process, an oxide film serving as passivation film 29 shown in FIG. 18 is formed on the side surface of the memory cell layer including the diode.

Thereafter, the second interlayer insulating film deposition (step S26), planarization (step S27) and the second wiring metal layer deposition (step S28) are sequentially performed, and then bit line patterning process, i.e., second etching process is performed (step S29). This etching process step S29 corresponds to step S12 in FIG. 11.

As a result of this process, another side wall of the variable resistance element film is exposed. In this state, second oxide film forming process is performed (step S30), so that an oxide film as a passivation film 30 is formed on the side wall of the variable resistance element film including the diode.

Then, the third interlayer insulating film is deposited between bit lines (step S31) and planarized (step S32). So far, the cross-point type of basic cell array is obtained.

Thereafter, repeatedly performing from the barrier metal deposition to the third interlayer insulating film deposition and planarization (step S33), the 3-D cell array is obtained. Further, other metal wirings are formed (step S34).

A suitable oxide formed in the first and second oxide formation steps S25 and S30 is, for example, binary metal oxide (here, "metal" includes not only narrow-sensed metal but also transition metal, metalloid, non-metal and rare earth element as follows: chromium (Cr), tungsten (W), vanadium (V), niobium (Nb), tantalum (Ta), titanium (Ti), zirconium (Zr), hafnium (Hf), scandium (Sc), yttrium (Y), thallium (Tl), manganese (Mn), iron (Fe), ruthenium (Ru), osmium (Os), cobalt (Co), nickel (Ni), cupper (Cu), zinc (Zn), cadmium (Cd), aluminum (Al), gallium (Ga), indium (In), silicon (Si), germanium (Ge), tin (Sn), lead (Pb), antimony (Sb), bismuth (Bi) and rare earth elements from lanthanum (La) to lutetium (Lu). For example, $Al_2O_3$, Cuo, $SiO_2$ and the like may be used.

Additionally, as the suitable oxide serving as the passivation film, it may also be used complex metal oxide such as barium titanium oxide ($BaTiO_3$), strontium titanium oxide ($SrTiO_3$), calcium titanium oxide ($CaTiO_3$), potassium niobium oxide ($KNbO_3$), bismuth iron oxide ($BiFeO_3$), lithium niobium oxide ($LiNbO_3$), sodium vanadium oxide ($Na_3VO_4$), iron vanadium oxide ($FeVO_3$), titanium vanadium oxide ($TiVO_3$), chromium vanadium oxide ($CrVO_3$), nickel vanadium oxide ($NiVO_3$), magnesium vanadium oxide ($MgVO_3$), calcium vanadium oxide ($CaVO_3$), lanthanum vanadium oxide ($LaVO_3$), vanadium molybdenum oxide ($VMoO_5$ or $V_2MoO_8$), lithium vanadium oxide ($LiV_2O_5$), magnesium silicon oxide ($Mg_2SiO_4$ or $MgSiO_3$), zirconium titanium oxide ($ZrTiO_4$), lanthanum cupper oxide ($LaCuO_4$), lead magnesium oxide ($PbMgO_3$), lead niobium oxide ($PbNbO_3$), barium boron oxide ($BaB_2O_4$), lanthanum chromium oxide ($LaCrO_3$), lithium titanium oxide ($LiTi_2O_4$), lanthanum cupper oxide ($LaCuO_4$), zinc titanium oxide ($ZnTiO_3$), calcium tungsten oxide ($CaWO_4$) and the like.

Figure 20:
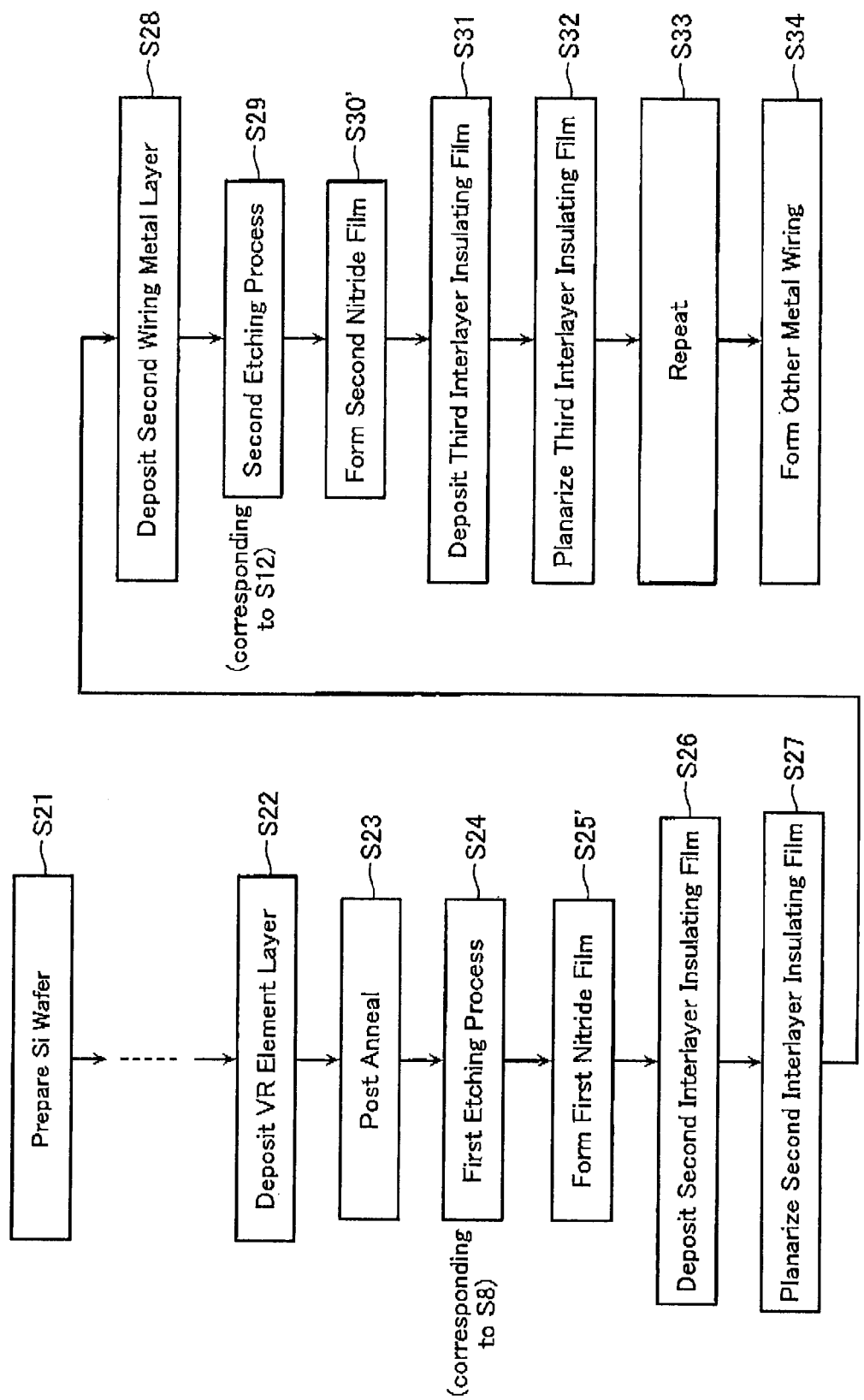
FIG. 20 shows a process flow, in which post anneal process and nitride forming process are added to that shown in FIG. 11.

FIG. 20 shows another process flow, in which with respect to the variable resistance element VR, a post anneal step and a nitride film forming step are added to that shown in FIG. 11. In FIG. 20, the same steps as in FIG. 19 are attached with the same references.

The process from step S21 of preparing the silicon substrate to step S22 of depositing the variable resistance element layer is not different from that in accordance with steps S1 to S7 shown in FIG. 11. After depositing necessary variable resistance element films, change the temperature and gas atmosphere in the presently used deposition apparatus, and perform post anneal process for the variable resistance element films (step S23).

Adding this post annealing process, the resistance value of the variable resistance element film, i.e., set resistance Rset of the variable resistance element VR, may be made to be optimal.

Next, first etching process is performed for forming the word line pattern correspondingly to the step S8 (step S24). So far, the process flow is the same as that shown in FIG. 19. As a result of this process, the side wall of the variable resistance element film is exposed. In this state, first nitride film forming process is performed for forming a nitride film as a passivation film on the side wall of the variable resistance element film (step S25'). This step corresponds to the first oxide film formation step S25 in FIG. 19.

Thereafter, as similar to the flow shown in FIG. 19, the second interlayer insulating film deposition (step S26), planarization (step S27) and the second wiring metal layer deposition (step S28) are sequentially performed, and then bit line patterning process, i.e., second etching process is performed (step S29).

As a result of this process, another side wall of the variable resistance element film is exposed. In this state, second nitride film forming process is performed (step S30').

In accordance with the first and second nitride film forming steps S25' and S30', as shown in FIGS. 18 and 17, passivation films 29 and 30 are formed on the side wall of the variable resistance element film including the diode.

The successive process flows are the same as those in FIG. 19.

Preferable nitride, which is formed in the first and second nitride film formation steps S25' and S30', is as follows; titanium nitride (TiN), gallium nitride (GaN), indium nitride (InN), aluminum nitride (AlN), boron nitride (BN), silicon nitride (SiN), magnesium nitride (MgN), molybdenum nitride (MoN), calcium nitride (CaN), niobium nitride (NbN), tantrum nitride (TaN), barium nitride (BaN), zinc nitride (ZnN), zirconium nitride (ZrN), iron nitride (FeN), cupper nitride (CuN), barium nitride (BaN), lanthanum nitride (LaN), chromium nitride (CrN), yttrium nitride (YN) and titanium nitride (TiN). Additionally, complex nitride, which is a mixture of the above-described nitride, may be used.

In addition, many kinds of oxinitride are usable as the passivation films. Typical oxinitride is, for example, SiAlON of IA, IIA or IIIB element, or complex SiAlON such as barium SiAlON (BaSiAlON), calcium SiAlON (CaSiAlON), cerium SiAlON (CeSiAlON), lithium SiAlON (LiSiAlON), magnesium SiAlON (MgSiAlON), scandium SiAlON (ScSiAlON), yttrium SiAlON (YSiAlON), erbium SiAlON (ErSiAlON) and neodymium SiAlON (NdSiAlON). Further, as other oxinitride, LaSiON, $LaEuSi_2O_2N_3$, $SiON_3$ and the like may be usable.

As described above, performing oxidization or reduction process, and passivation film forming process, set resistance Rset is suitably set, and the device property is stabilized. Explaining in detail, side wall leakage current of the metal oxide element may be reduced, and data retention may be improved. According to this embodiment, also in the variable resistance element formed of multi-element metal oxide, it is possible to make the variable resistance element optimal and stable.

[Method of Fabricating 3-D Cell Array (Part 2)]

In the 3-D cell array fabrication process described above, for the respective cell array layers, twice L/S processing steps, i.e., word line patterning and bit line patterning, are used. By contrast, it is possible to perform L/S processing in such a manner as to penetrate through two cell array layers continuously stacked.

Next, such the 3-C cell array fabricating process will be explained with reference to FIGS. 21 to 28, which show the perspective views of the respective steps. Each perspective view includes II-II' sectional view (in the bit line direction) and I-I' sectional view (in the word line direction) shown in FIG. 5.

Figure 21:
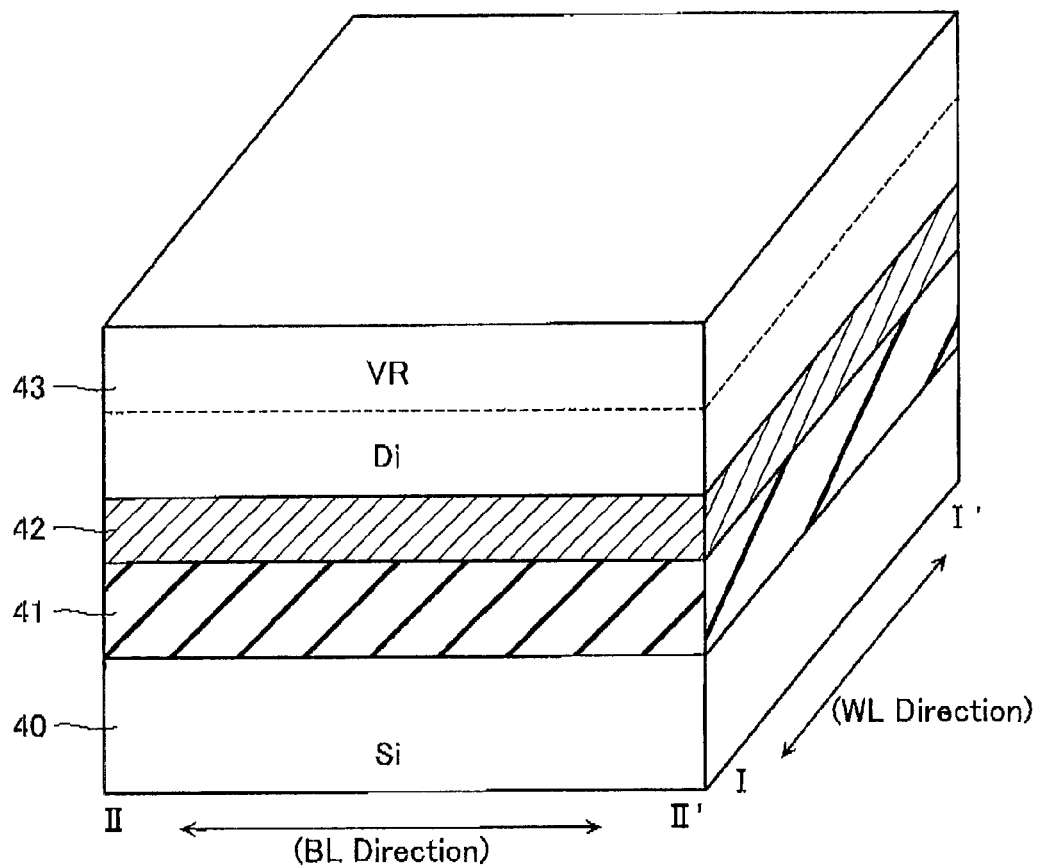
FIG. 21 is a perspective view showing process up to the first memory cell layer deposition in accordance with another cell array fabrication method.

As shown in FIG. 21, as similar to the above-described 3-D cell array fabrication process, a metal layer (serving as word lines 42) is formed on the FEOL substrate (i.e., silicon substrate 40 on which metal wirings and interlayer insulating film 41 are formed), and memory cell layer 43 is stacked. Memory cell layer is formed in practice as a multi-layered film containing variable resistance element VR, diode Di, electrodes, barrier metals, poly-silicon films and the like. However, the memory cell layer 43 is shown here as a simplified drawing. Other memory cell layers described below will be shown as the same simplified drawings.

Figure 22:
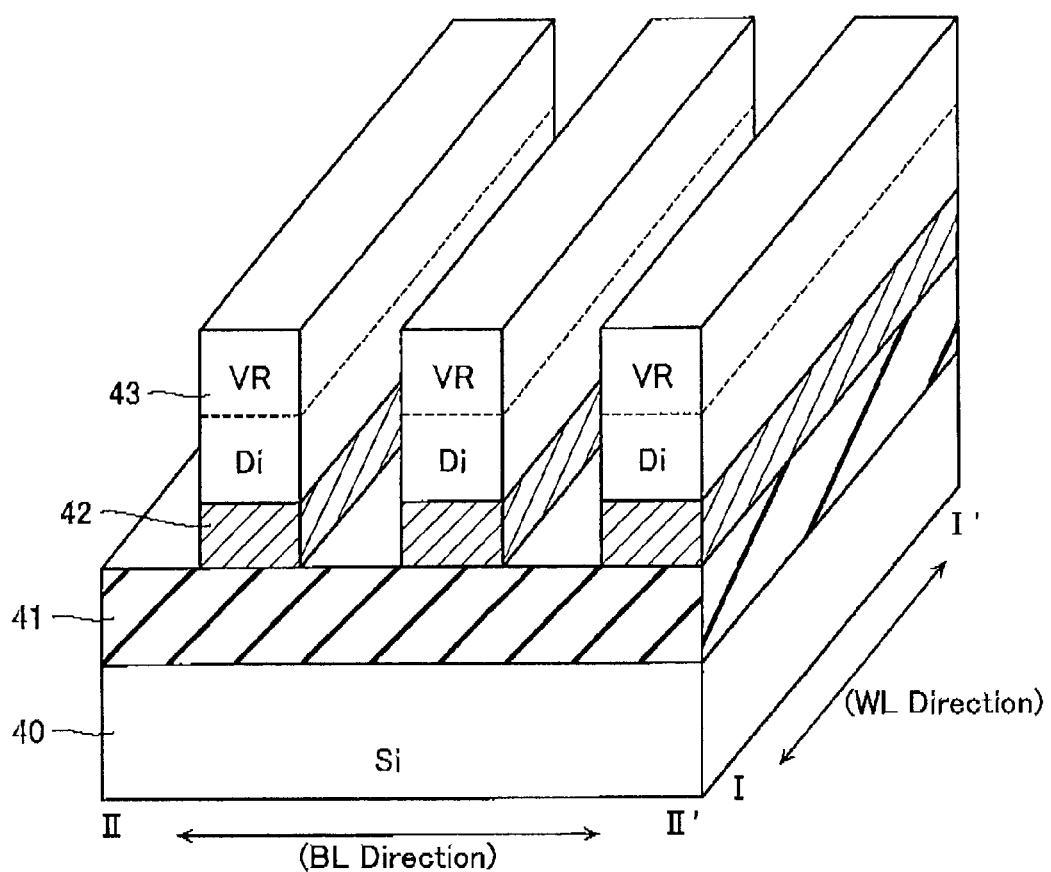
FIG. 22 is a perspective view showing L/S process of word lines in accordance with the cell array fabrication method.

Next, as shown in FIG. 22, perform L/S processing for the memory cell layer 43 and the underlying metal wiring layer to form word lines 42, on which memory cell layers 43 are stacked. Following it, as shown in FIG. 23, bury interlayer insulating film 44 in the space portions between word lines 42, and then planarize it.

Figure 23:
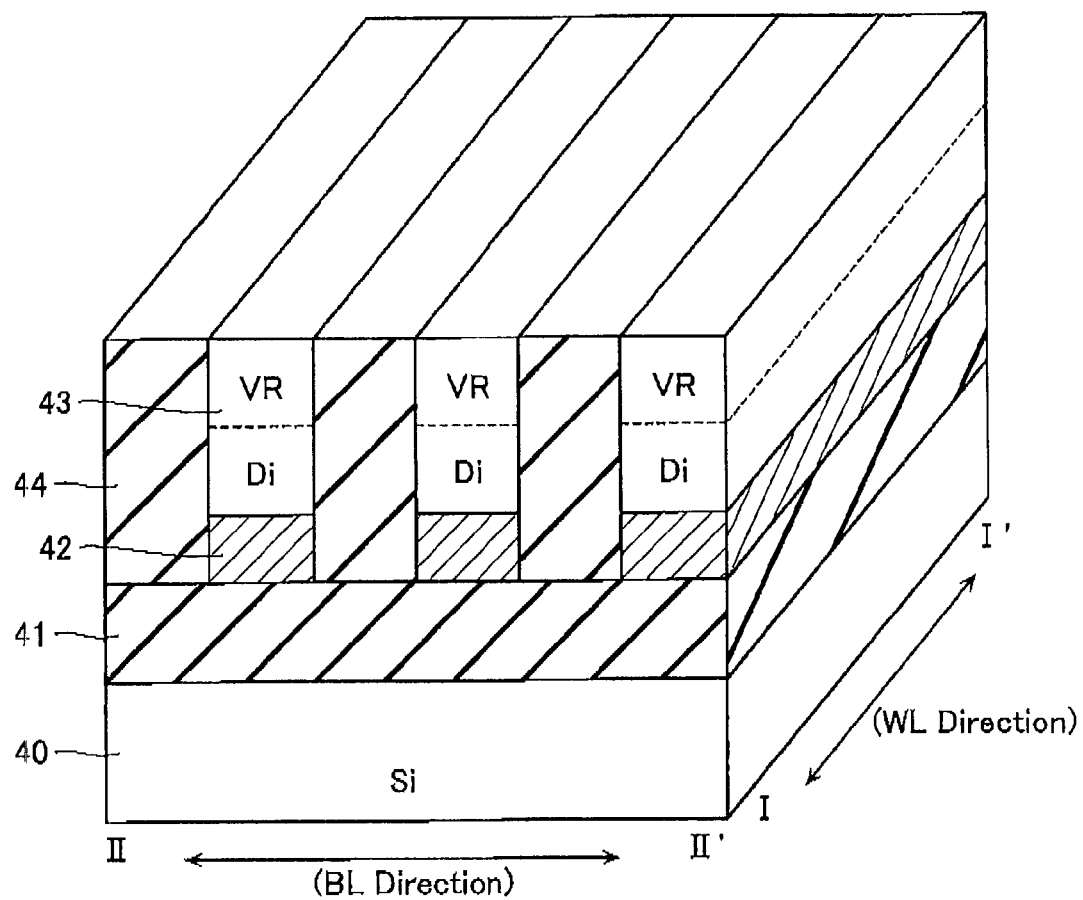
FIG. 23 is a perspective view showing the interlayer insulating film burying in accordance with the cell array fabrication method.
Figure 24:
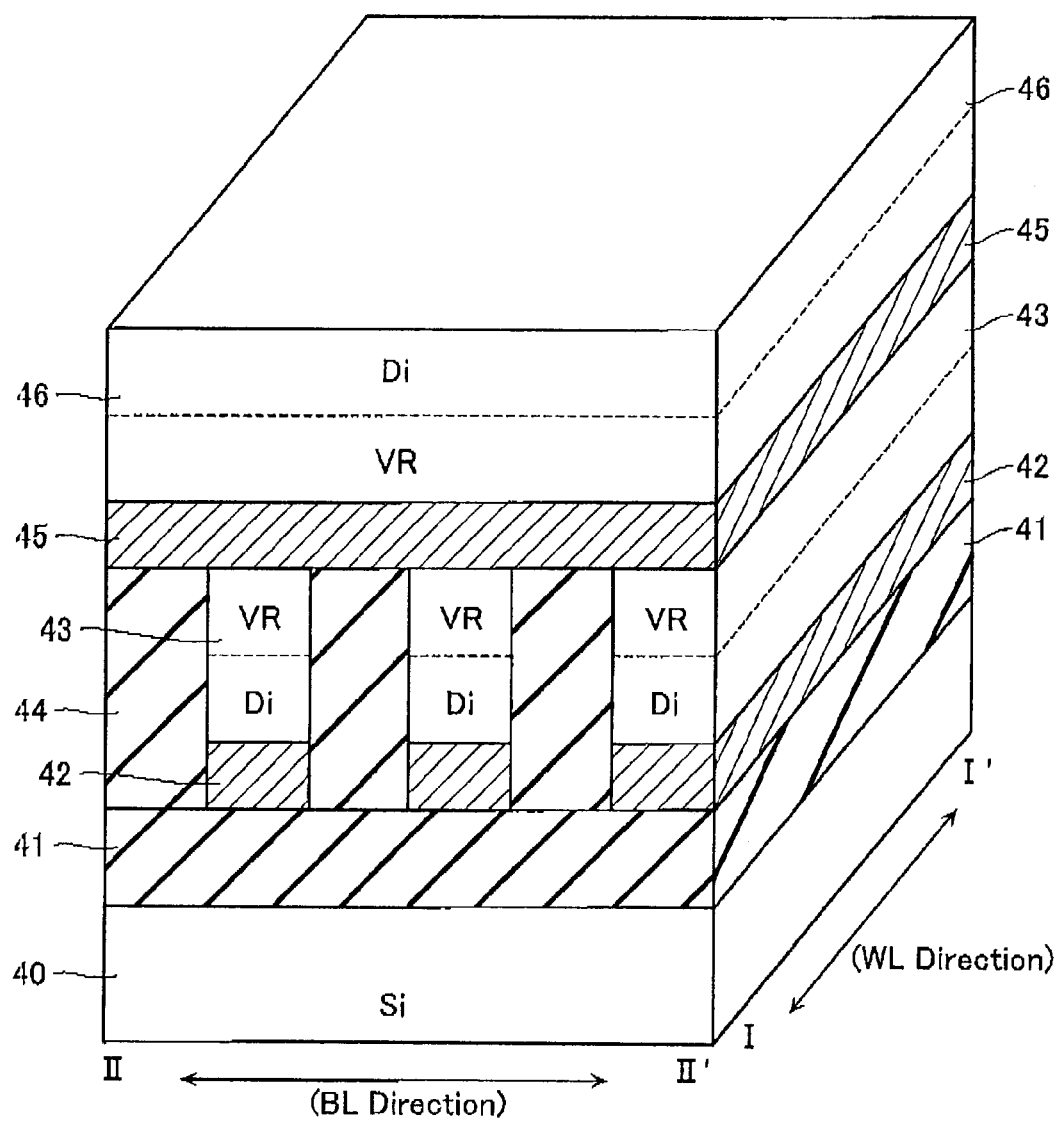
FIG. 24 is a perspective view showing up to the second memory cell layer deposition in accordance with the cell array fabrication method.

Thereafter, as shown in FIG. 23, deposit a wiring metal layer serving as bit lines 45, and successively deposit the next memory cell layer 46 without patterning the underlying wiring metal layer. Memory cell layer 46 will be deposited in accordance with a certain film deposition order in such a manner that a mirror image relationship is satisfied between cell array layers 43 and 46 with a center defined by the bit line 45.

Figure 25:
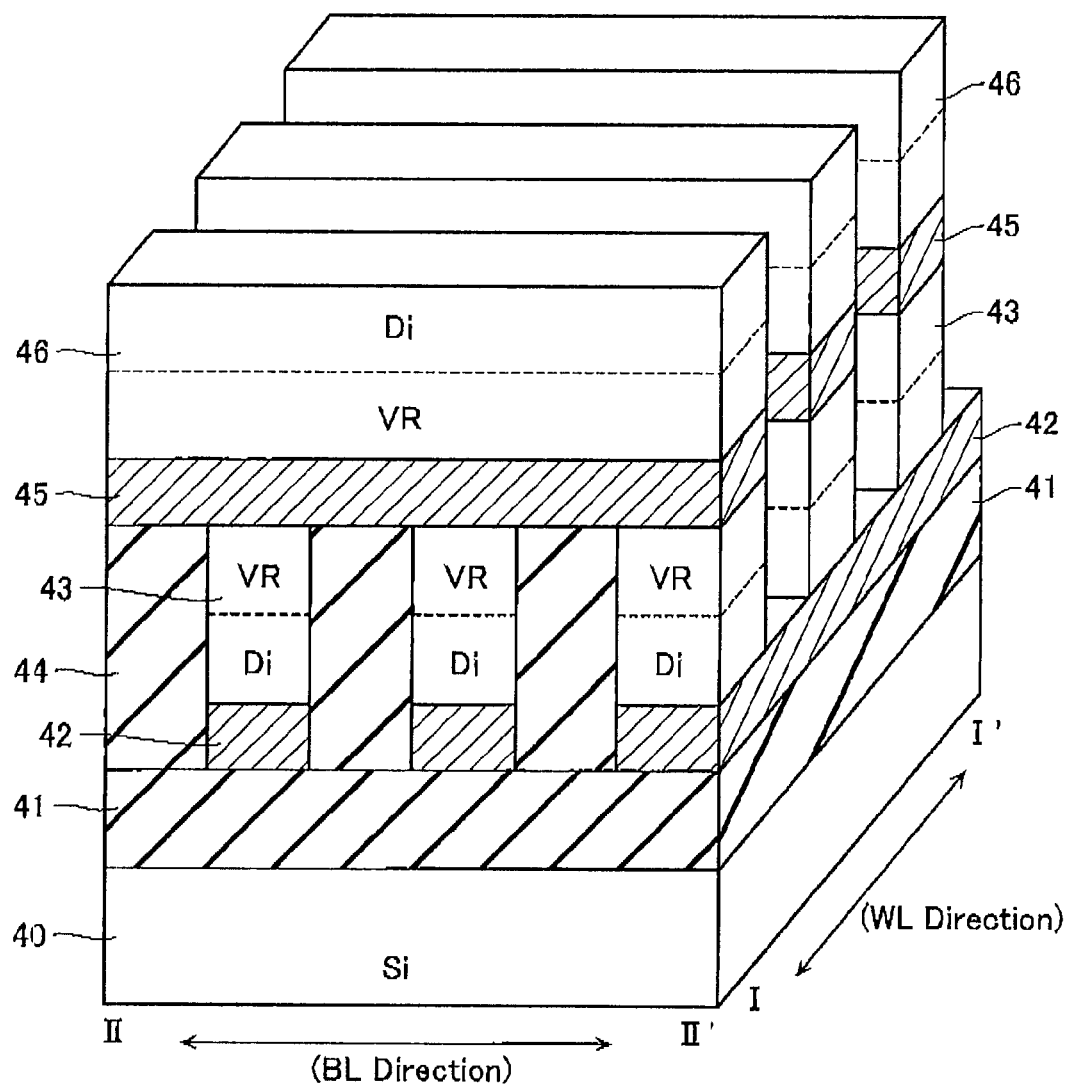
FIG. 25 is a perspective view showing L/S process of bit lines in accordance with the cell array fabrication method.

Then, as shown in FIG. 25, L/S processing is performed for forming bit lines 45. This L/S processing is performed for penetrating through the two cell layers 46 and 43. That is, memory cell layer 46, wiring metal layer 45 and memory cell layer 43 are continuously etched until when the word lines 42 are exposed.

As a result, the first memory cell layers 43 are remained only at the respective cross-points of the word lines 42 and bit lines 45, which have been patterned to cross each other. Bit lines 45 are patterned in such a manner that memory cell layers 46 are stacked thereon.

Figure 26:
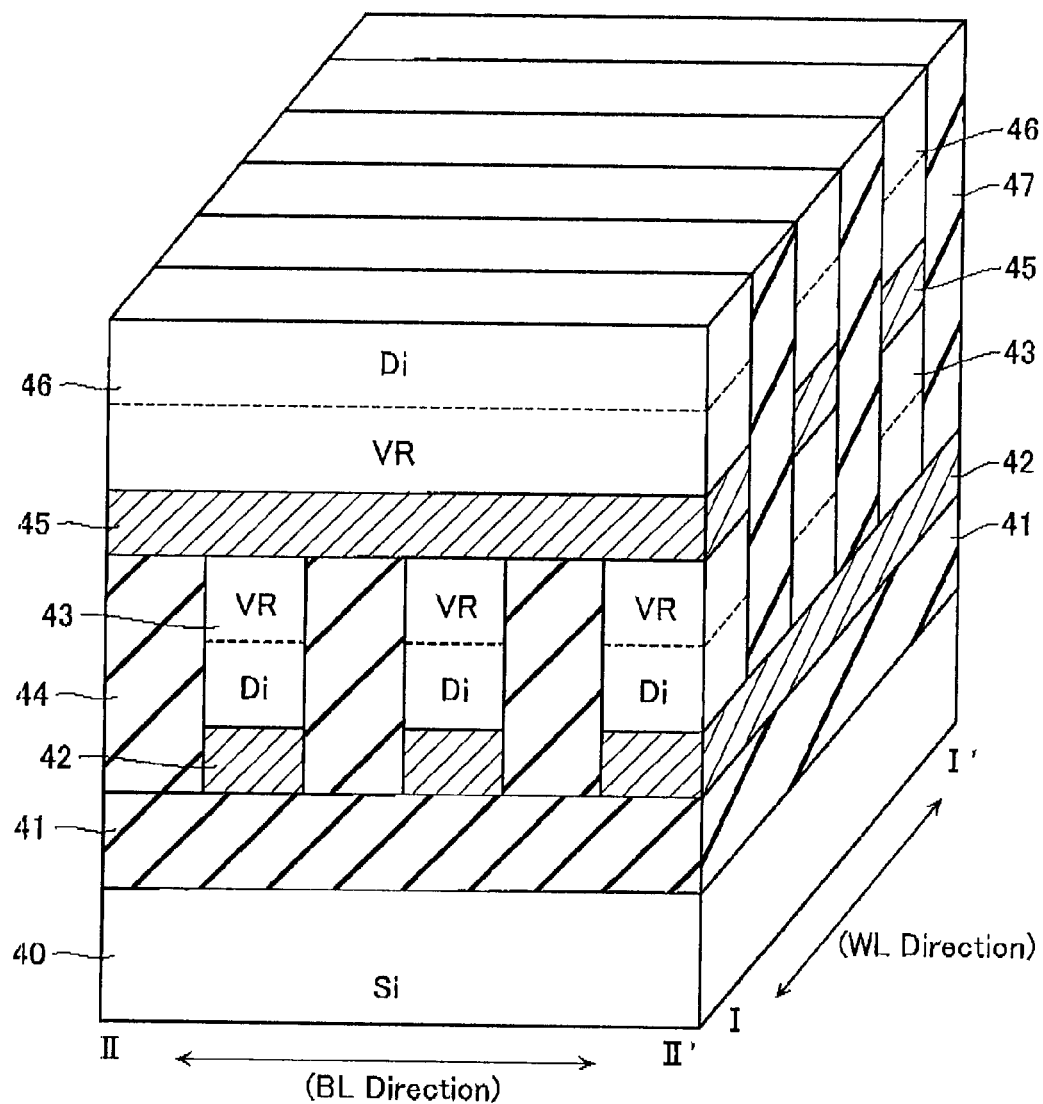
FIG. 26 is a perspective view showing the interlayer insulating film burying in accordance with the cell array fabrication method.

Then, as shown in FIG. 26, bury interlayer insulating film 47 in the space portions between bit lines 45, and planarize it.

Figure 27:
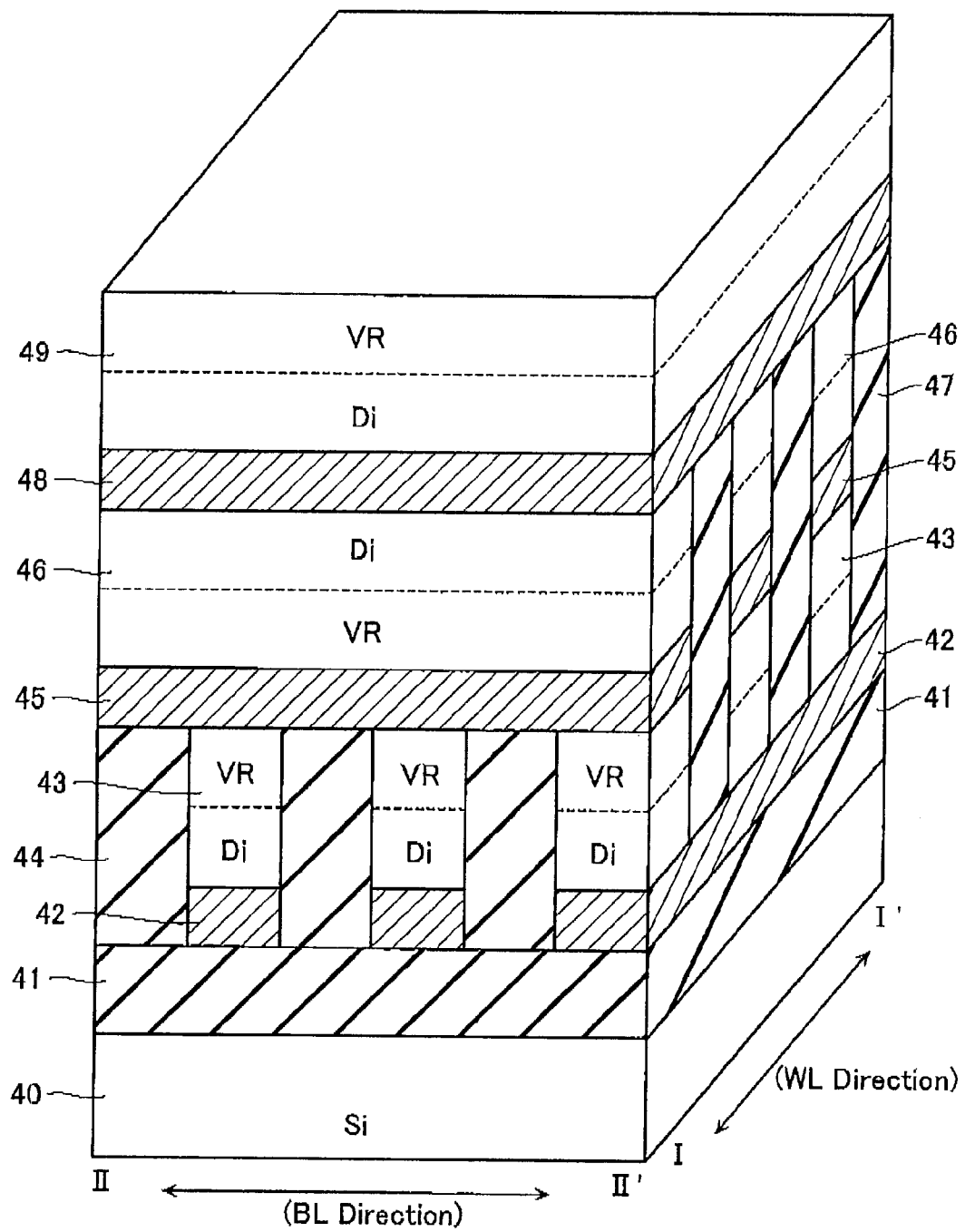
FIG. 27 is a perspective view showing up to the third memory cell layer deposition in accordance with the cell array fabrication method.

Next, as shown in FIG. 27, deposit a wiring metal layer serving as bit lines 48, and successively deposit the next memory cell layer 49 without patterning the underlying wiring metal layer. Memory cell layer 49 will be deposited in accordance with a certain film deposition order in such a manner that a mirror image relationship is satisfied between cell array layers 46 and 49 with a center defined by the word line 48.

Figure 28:
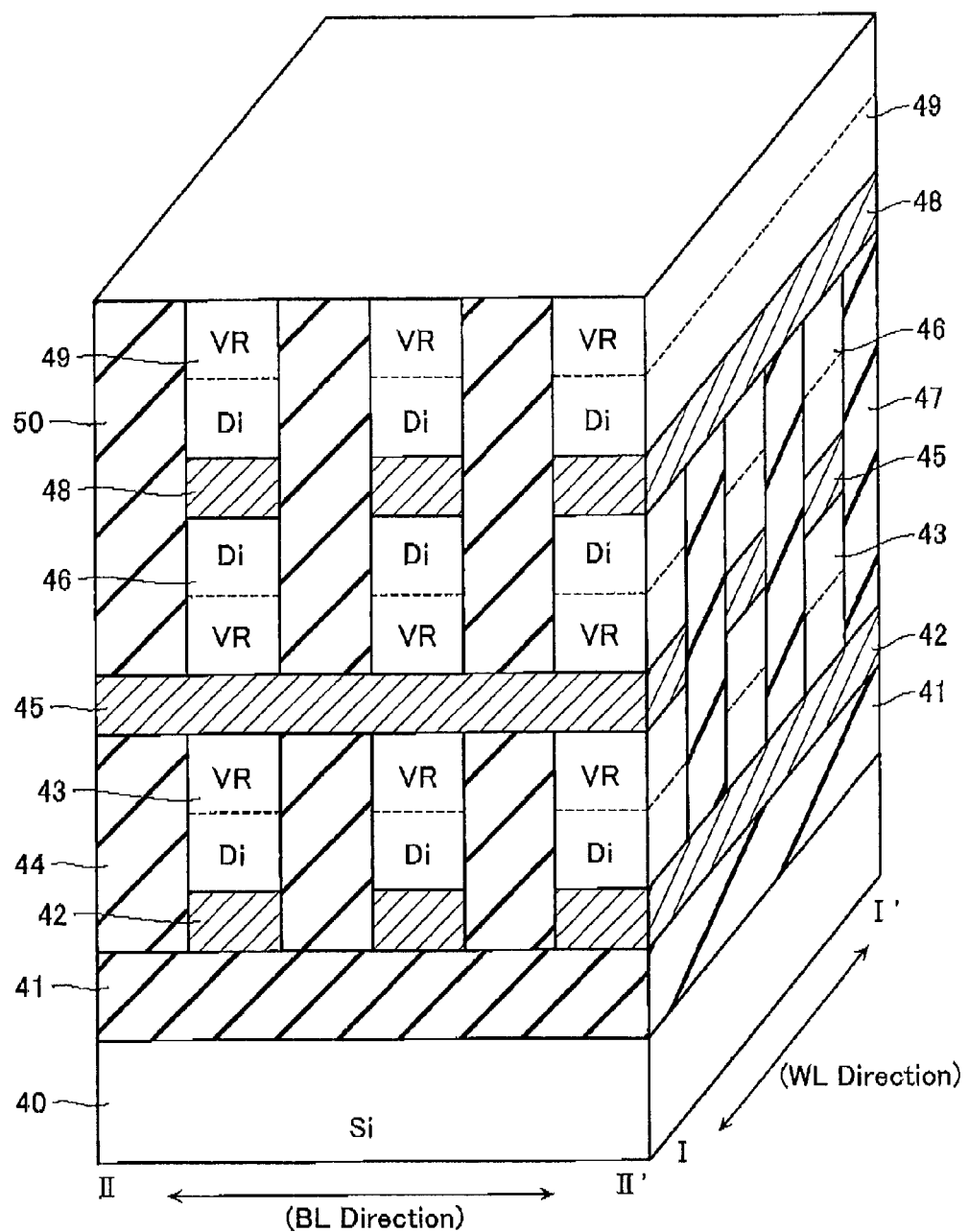
FIG. 28 is a perspective view showing the L/S process of word lines and interlayer insulating film burying in accordance with the cell array fabrication method.

Then, as shown in FIG. 28, L/S processing is performed for forming word lines 48. This L/S processing also is performed for penetrating through the two cell layers 49 and 46. That is, memory cell layer 49, wiring metal layer 48 and memory cell layer 46 are continuously etched until when the bit lines 45 are exposed. Thereafter, interlayer insulating film 50 is buried in the space portions between word lines 48, and planarized.

As described above, two memory cell array layers are repeatedly subjected to L/S processing for necessary steps, multi-layered cell arrays may be obtained.

[Method of Fabricating 3-D Cell Array (Part 3)]

In the above-described methods of fabricating 3-D cell array, bit lines and word lines are etched in a state that the array wiring layer and memory cell layer are stacked, so that memory cells are self-aligned and remained only at the cross points of the bit lines and word lines. By contrast, it may be used such a method that the wiring metal layer and memory cell layer are individually deposited and patterned. With this method, pillar-type of memory cells may be formed on the word lines and bit lines.

Figure 29:
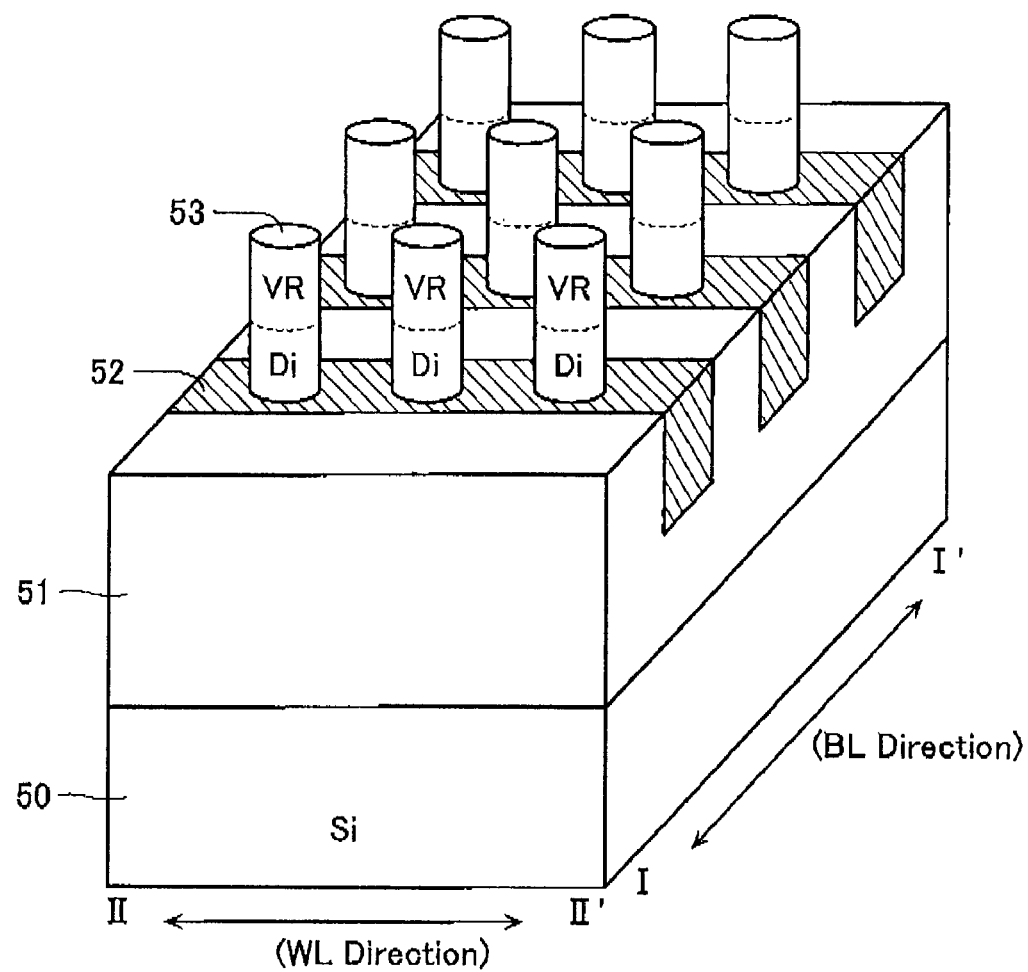
FIG. 29 is a perspective view showing the first memory cell layer forming process in accordance with still another cell array fabrication method.

The above-described method will be explained in brief with reference to FIGS. 29 and 30. As shown in FIG. 29, word lines 52 are formed on the FEOL substrate, which has silicon substrate 40 covered with interlayer insulating film 41. In the interlayer insulating film 41, there are formed metal wirings (not shown). The word lines 52 are formed with a damascene method. That is, wiring trenches are formed on the interlayer insulating film 51, and a metal layer (TiW) is deposited thereon. The metal layer is subjected to CMP process to be buried only in the trenches.

Different from the above-described 3-D cell array process, the memory cell layer is not yet formed in this word line forming step.

Next, deposit a memory cell layer including variable resistance element VR and diode Di on the surface, on which word lines 52 have been patterned, and pattern it with RIE. As a result, as shown in FIG. 29, pillar-type memory cells 53 are arranged on the word lines 52 in a matrix manner to constitute a first cell array.

Figure 30:
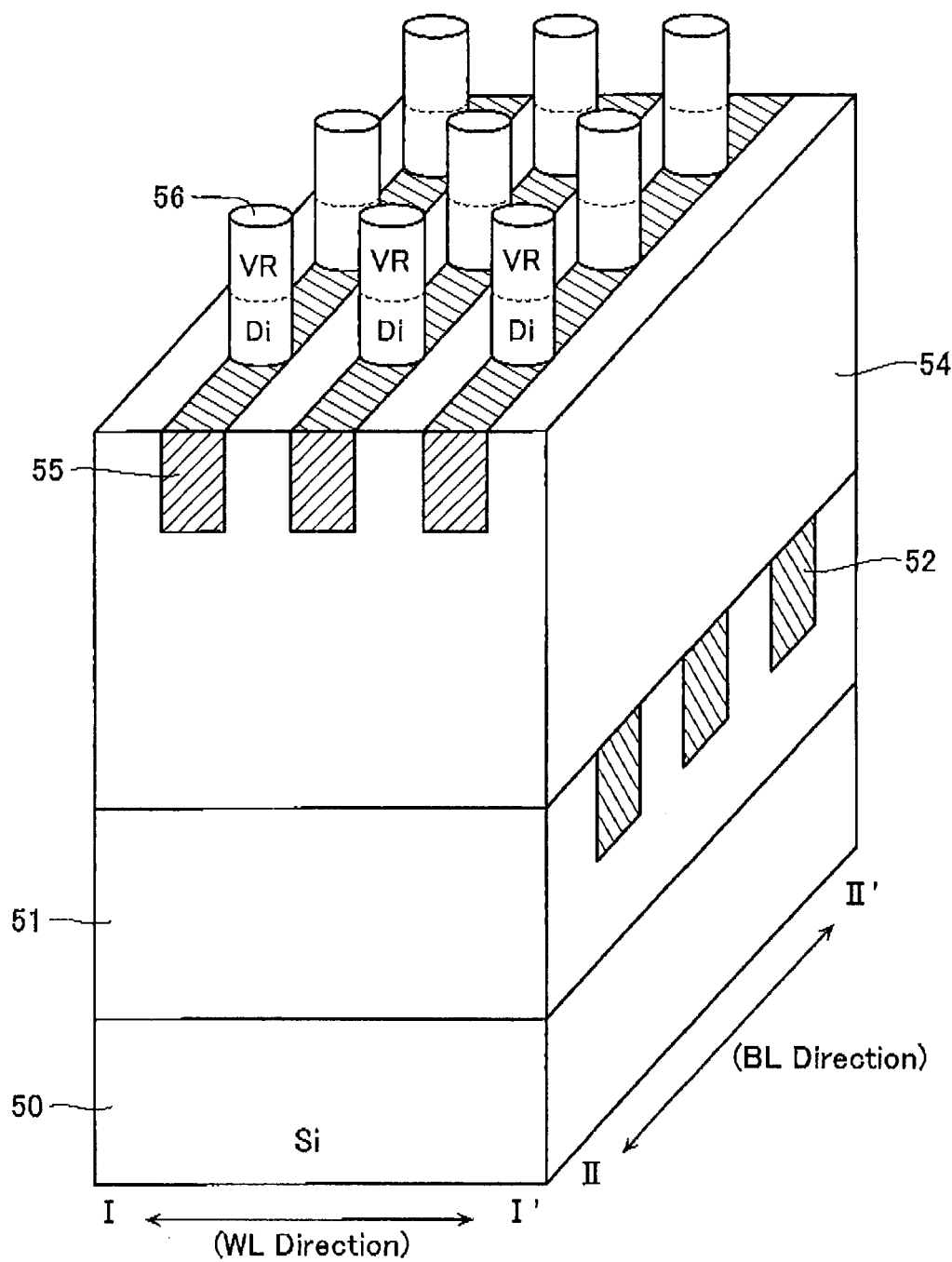
FIG. 30 is a perspective view showing the second memory cell layer forming process in accordance with the cell array fabrication method.

Following it, as shown in FIG. 30, deposit interlayer insulating film 54 around the memory cells 53, and planarize it with CMP process. In addition, deposit and pattern a wiring metal layer. As a result, bit lines 55 are formed to be contacted with the upper surface of the memory cells 53. Successively, deposit a memory cell layer including variable resistance element VR and diode Di on the surface, on which bit lines 55 have been patterned, and pattern it with RIE.

As a result, as shown in FIG. 30, pillar-type memory cells 56 are arranged on the bit lines 55 in a matrix manner to constitute a second cell array.

The above-described processes are repeatedly performed (not shown), so that 3-D cell array may be formed in such a manner that the respective adjacent cell arrays share bit lines and word lines.

[BL and WL Hook-Up Structure]

Word lines and bit lines in the 3-D cell array described above are led and coupled to the underlying substrate via "contact conductors" or "lead conductors" buried vertically in the interlayer insulating in the wiring hook-up area disposed around the cell array. The hook-up structure will be explained below. The contact conductor or lead conductor is referred to as a "zia contact" hereinafter.

Figure 31:
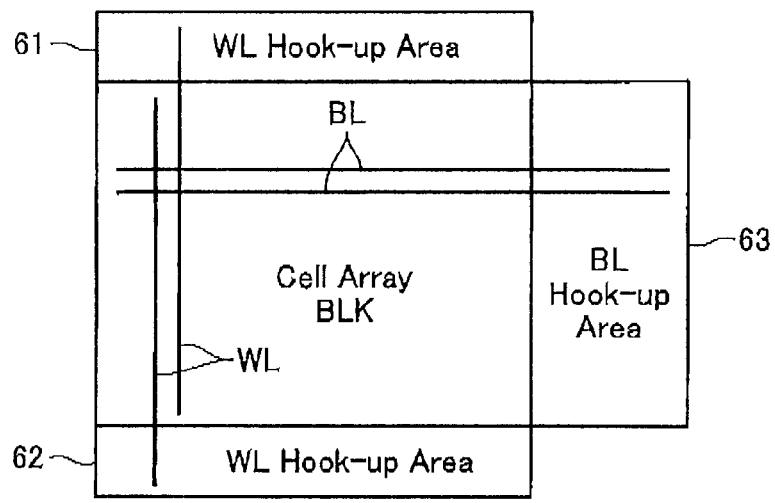
FIG. 31 is a layout of word line and bit line hooking-up areas.
Figure 32:
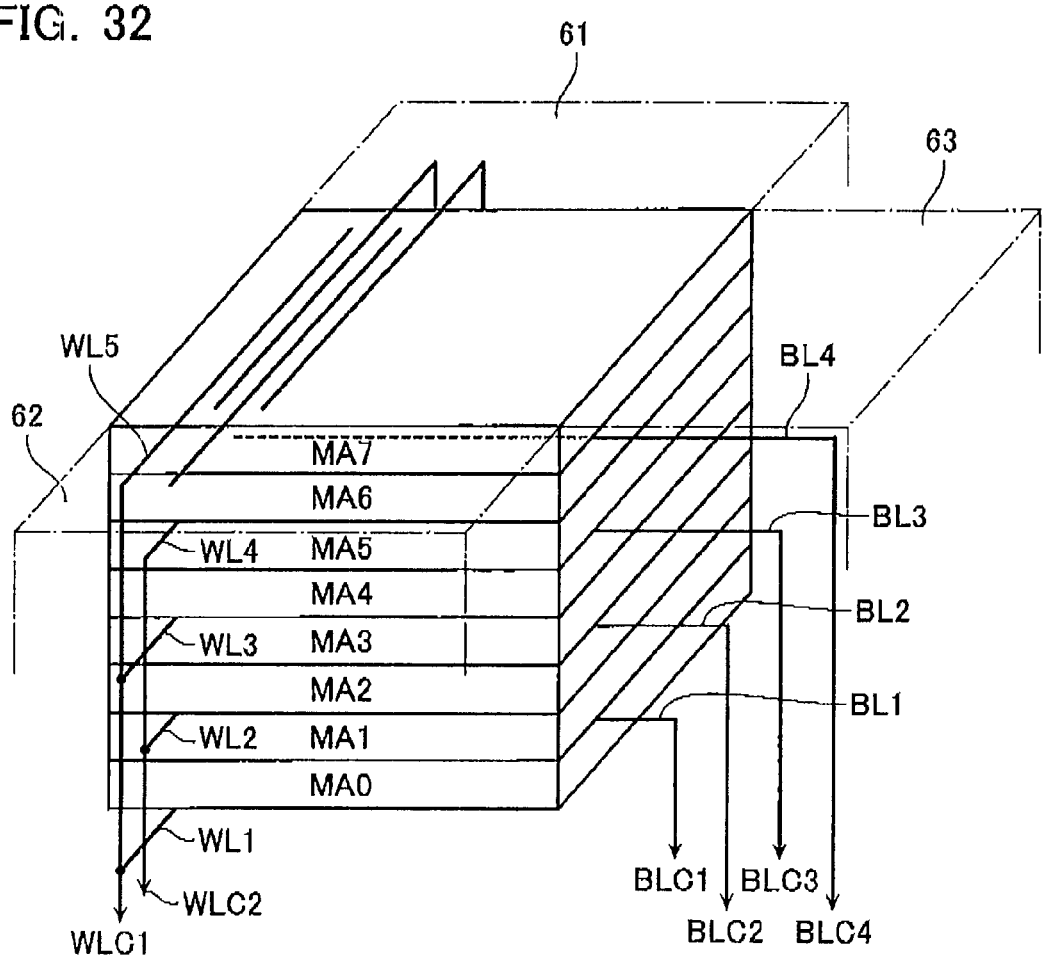
FIG. 32 is a perspective view for explaining the bit line and word line hooking-up method.

FIGS. 31 and 32 shows an arrangement example of word line (WL) hook-up area 61, 62 and bit line (BL) hook-up area 63 of the 3-D cell array, noticing one cell array block BLK. That is, on the both sides of the word line direction of the cell array block BLK, WL hook-up areas 61 and 62 are disposed for alternately leading the word lines, which are arrayed at the minimum pitch, to hook-up portions in the WL hook-op areas 61 and 62. By contrast, BL hook-up area 63 is disposed on one side of the cell array block BLK in the bit line direction, and bit lines are coupled to hook-up portions in the BL hook-up area 63.

Disposed in these hook-up areas 61, 62 and 63 are "hook-up portions or components" and "zia contacts", which are used for coupling the word lines and bit lines to the underlying substrate. Each of hook-up portions is formed of a pair of metal pieces, which are continued to the word line WL or bit line BL, and opposed to each other with a certain space. The metal pieces are hooked-up with the zia contacts buried in the interlayer insulating film. That is, contact holes are formed to overlap the pair of metal pieces, and contact metal is buried in them as "zia contacts". As a result, word line WL or bit line BL is led to the underlying substrate via the zia contacts.

Assume here that cell array block BLK has, for example, as shown in FIG. 32, eight cell array MA0-MA7, in which eight memory cells MC are stacked.

With respect to the word lines WL1 to WL5 in the cell array block, odd-layered word lines WL1, WL3 and WL5 are coupled in common to each other in the hook-up areas 61 and 62, and led to word line contact node WLC1 on the FEOL substrate. Even-layered word lines WL2 and WL4 are also coupled in common to each other in the hook-up areas 61 and 62, and led to another word line contact nodes WLC2. By contrast, bit lines BL1 to BL4 are individually led to bit line contact nodes BLC1 to BLC4, respectively, in the bit line hook-up area 63.

In FIGS. 31 and 32, only one cell array block is shown. In a practical memory chip, plural cell array blocks are arranged in a matrix manner, and WL hook-up areas 61, 62 and BL hook-up areas 63 are shared by adjacent two cell array blocks.

Further, it should be noted in FIGS. 31 and 32 that there may be prepared BL hook-up areas on the both sides of the cell array block like the WL hook-up areas.

Figure 33:
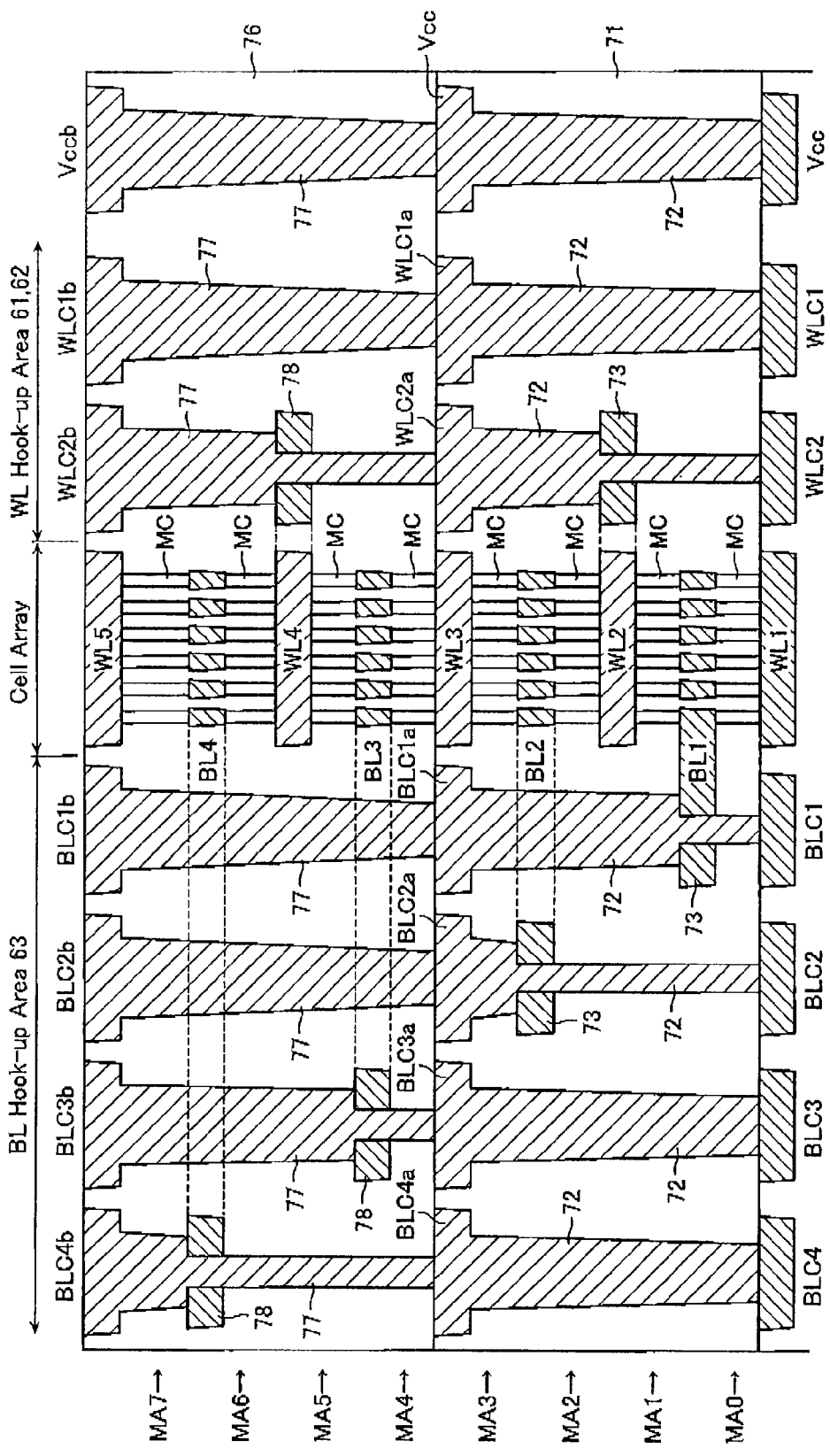
FIG. 33 is a sectional view showing the zia contact array portions of word line and bit line hooking-up areas, which are spread out in the same sectional view.

FIG. 33 shows a sectional structure of the BL hook-up area 63 and WL hook-up areas 61 and 62. Here, zia contact (72, 77) arrayed portions of the word line hook-up areas (61, 62), which are shown on the right side in FIG. 33, and zia contact (72, 77) arrayed portions of bit line hook-up areas 63, which are shown on the left side in FIG. 33, are shown in such a state that these are spread out in one plane.

Bit line contact node BLC1-BLC4, word line contact nodes WLC1, WLC2 and power supply node Vcc are formed simultaneously with the word line WL1 by use of the lowermost word line metal film. It should be noted that these metal nodes are coupled to necessary circuit nodes via metal wirings formed on the FEOL substrate.

Zia contacts 72 and 77 are buried after plural cell arrays are stacked. Explaining in detail for the example shown in FIG. 33, the lower zia contacts 72 are buried in the interlayer insulating film 71 after four cell arrays MA0-MA3 are stacked; and the upper zia contacts 77 are buried in the interlayer insulating film 76 after four cell arrays MA4-MA7 are stacked so as to be contacted with the underlying zia contacts 72.

The lower zia contacts 72 are "contact conductors" (or lead conductors), which are used for not only leading the bit lines and word lines in the cell arrays MA0-MA3 to the corresponding word line contact nodes WLC1-WLC2, bit line contact nodes BLC1-BLC4 and power supply node Vcc but also leading the zia contacts 77 buried in the upper interlayer insulating film 76 to the corresponding word line contact nodes WLC1-WLC2, bit line contact nodes BLC1-BLC4 and power supply node Vcc.

To hook-up the word lines and bit lines in the respective cell array layers with the zia contacts 72 and 77, there are formed hook-up portions (or components) 73 and 78. These hook-up portions 73 and 78 each have pairs of metal pieces, which are formed of the same metal films as the corresponding word lines and bit lines as elongated portions thereof.

Zia contacts 72 are buried in the corresponding contact holes formed in the interlayer insulating film 71 so as to pass through the spaces between the metal pieces of the hook-up portions 73, and contacted with the contact nodes BLC1-BLC4, WLC1-WLC2 and Vcc. That is, zia contacts 72 are formed in the step-shape at the hook-up portions 73, and contacted with the upper surfaces and the side surfaces of the hook-up portions 73.

Further, the upper surface portions of the zia contacts 72 are shaped as contact nodes BLC1*a*-BLC4*a*, WLC1*a*-WLC2*a* and Vcca corresponding to the lower contact nodes BLC1-BLC4, WLC1-WLC2 and Vcc, respectively. Zia contacts 73 are, including the contact nodes BLC1*a*-BLC4*a*, WLC1*a*-WLC2*a* and Vcca, formed of the same metal film as the third word lines WL3.

Similarly, the upper zia contacts 77 are buried in the contact holes formed to pass through the spaces of metal pieces of the hook-up portions 78 to be contacted with the contact nodes BLC1*a*-BLC4*a*, WLC1*a*-WLC2*a* and Vcca. The upper surface portions of the zia contacts 77 are shaped as contact nodes BLC1*b*-BLC4*b*, WLC1*b*-WLC2*b* and Vccb corresponding to the lower contact nodes BLC1*a*-BLC4*a*, WLC1*a*-WLC2*a* and Vcca, respectively. Zia contacts 77 are, including the contact nodes BLC1*b*-BLC4*b*, WLC1*b*-WLC2*b* and Vccb, formed of the same metal film as the fifth word lines WL5.

Figure 34:
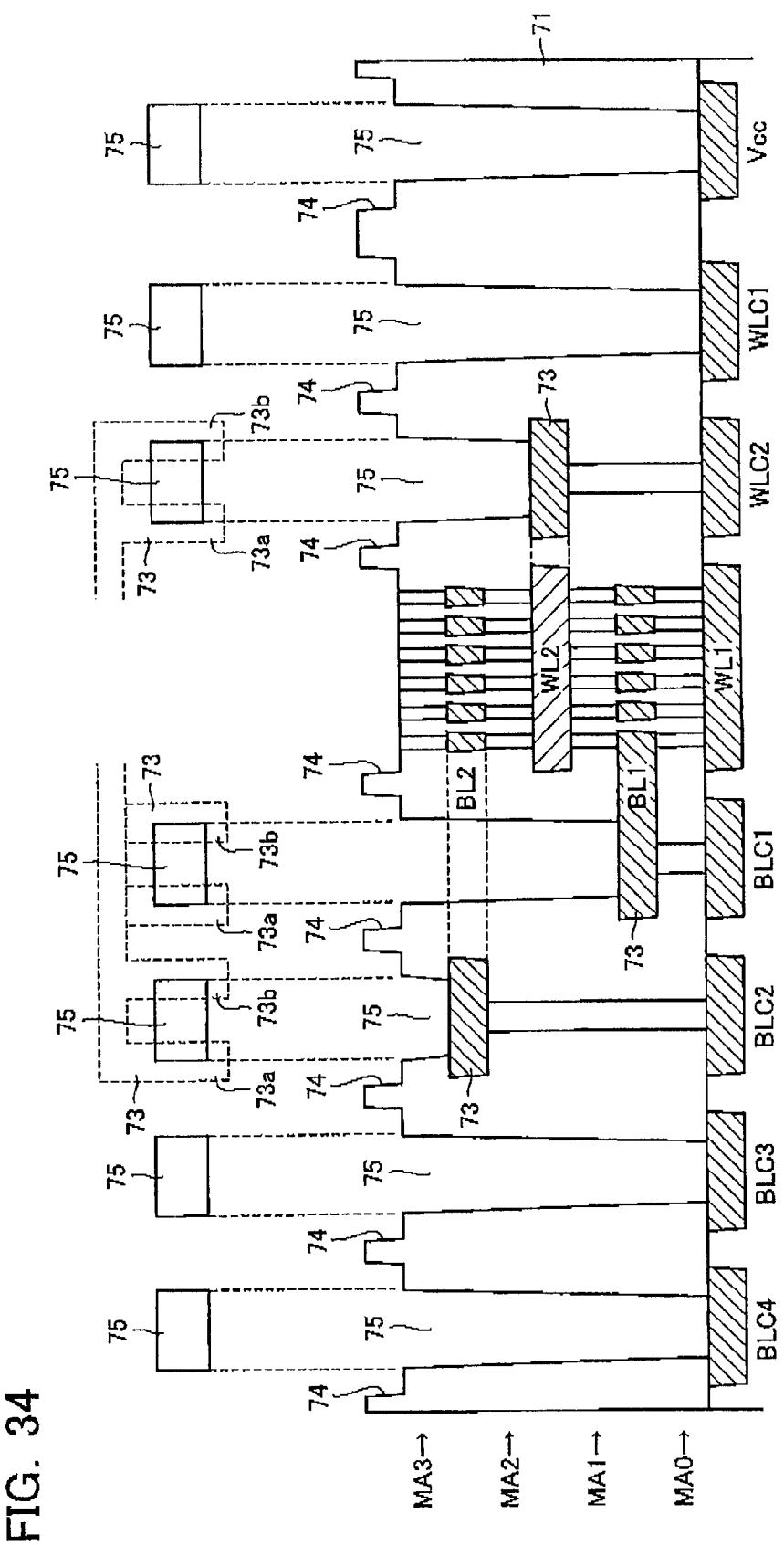
FIG. 34 is a sectional view showing the contact hole forming step after stacking four cell arrays.
Figure 35:
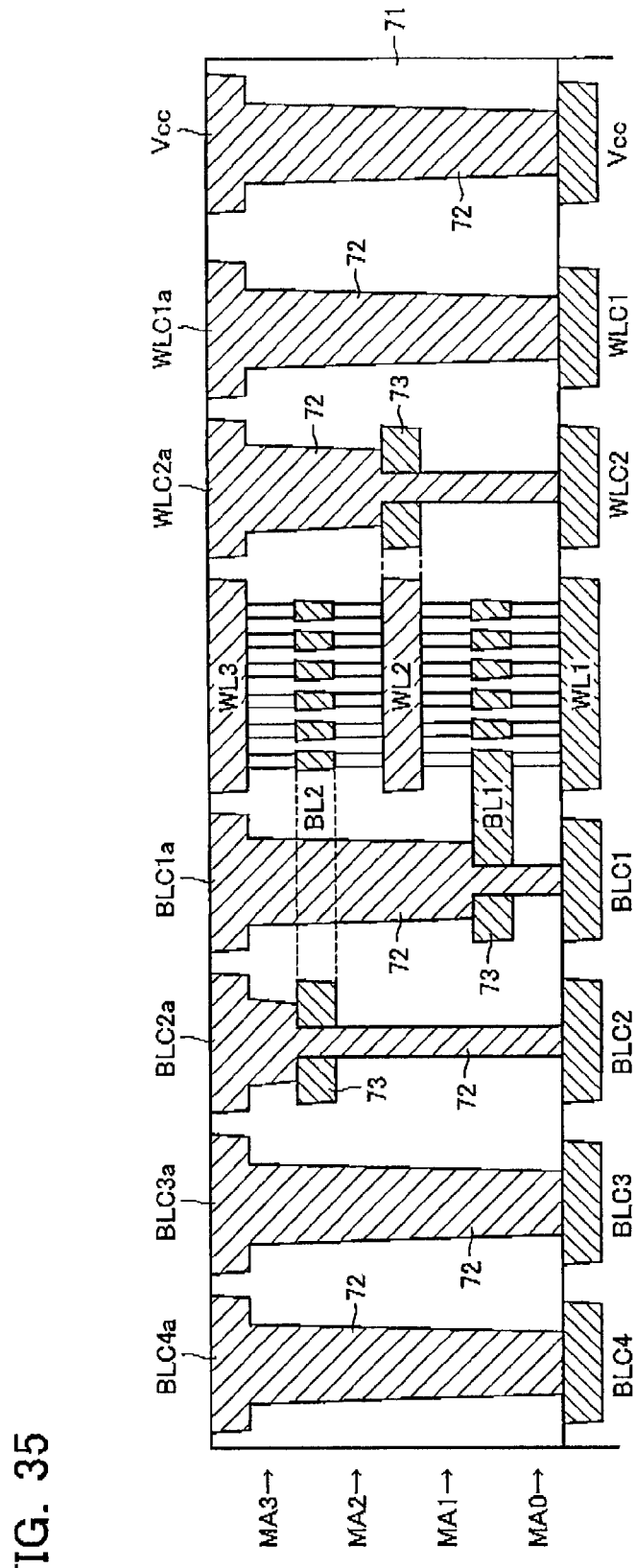
FIG. 35 is a sectional view showing the step of burying the third word lines and contact metal.

FIG. 34 shows a stacked structure of the former four cell arrays MA0-MA3, in which contact holes 75 are formed in the interlayer insulating film 71. Here is assumed such a dual damascene method that a metal layer is buried to constitute the third word lines WL3 and contact conductors simultaneously. However, the method of forming the word lines and contact conductors is not limited to the above-described damascene method.

Explaining in detail, wiring trenches 74 for burying word lines WL3 and contact nodes BLC1*a*-BLC4*a*, WLC1*a*-WLC2*a*, Vcca and contact holes 75 to be overlapped to the corresponding trenches 74 are etched and formed. At the positions where the hook-up portions 73 are buried, contact holes 75 are, as shown by plan views in FIG. 34, formed to overlap the pairs of metal pieces 73a and 73b in the hook-up portions 73.

Thereafter, as shown in FIG. 34, conductive material is buried in the wiring trenches 74 and contact holes 75. As a result, the third word lines WL3 are formed, and simultaneously with those, contact nodes BLC1a-BLC4a, WLC1a-WLC2a and Vcca are formed of the same metal film as the word lines WL3. In addition, contact plugs are buried simultaneously in the contact holes 75 as zia contacts 72.

The hook-up portions 73 buried in the lower four cell array layers are continued from the corresponding bit lines BL1, BL2 or word lines WL2. Therefore, these array wirings are electrically coupled to the lowest layer of contact nodes BLC1-BLC4, WLC1-WLC2 and Vcc via the hook-up portions 73 and zia contacts 72. Contact node WLC1a is continued from word line WL3, and it also serves for hooking-up the word line WL3 with zia contact 72 on the contact node WLC1.

Similarly, as shown in FIG. 33, the following four cell arrays MA4-MA7 are stacked, and zia contacts 77 are buried in the interlayer insulating film 76. In the hook-op areas, hook-up portions 78 are buried to lead the corresponding wirings as similar to the above-described former four cell arrays. That is, zia contacts 77 are buried to pass through the spaces between metal pieces of the hook-up portions 78, and connected with the wiring nodes BLC1a-BLC4a, WLC1a-WLC2a and Vcca.

In detail, in the upper four cell arrays, bit lines BL3, BL4 and word lines WL4 are led to the underlying contact nodes BLC3a, BLC4a and WLC2a via hook-up portions 78 and zia contacts 77. Word line WL5 is continued to contact node WLC1b, which also serves for hooking-up the word line WL5 with the zia contact 77 on the contact node WLC1a.

In accordance with the above-described zia contact structure, four-layer bit lines BL1, BL2, BL3 and BL4 are individually led to the substrate. That is, bit lines BL1, BL2, BL3 and BL4 are coupled to the corresponding zia contacts 72, 77 buried on the contact nodes BLC1-BLC4 via hook-up portions 73, 78, respectively, and led to the substrate.

In the WL hook-up areas 61, 62, contact nodes WLC1a and WLC1b of the zia contacts 72 and 77, which are overlapped on the contact node WLC1, are continued to word lines WL3 and WL5, respectively, so that odd-numbered word lines WL1, WL3 and WL5 are led and coupled in common to the contact nodes WLC1. As similar, even-numbered word lines WL2 and WL4 are coupled in common to the contact node WLC2 via hook-up portions 73 and 78 and zia contacts 72 and 77.

In FIG. 33, for example, zia contacts 72 are formed on bit line contact nodes BLC1 and BLC2, and further zia contacts 77 are stacked on them. In the portion, the upper zia contacts 77 are not necessary, but formed as dummy circuits for assuring the special uniformity of the zia contact forming process in the wiring hook-up area.

So far, it has been explained that wirings, contact nodes and zia contacts (step-shaped contacts) are simultaneously formed of the same wiring material film by use of a damascene method. It should be noted here that contact material burying and wiring and contact node forming may be performed independently of each other. Further, the above described dummy zia contacts may be omitted for the convenience of forming the upper wiring layers.

Figure 36:
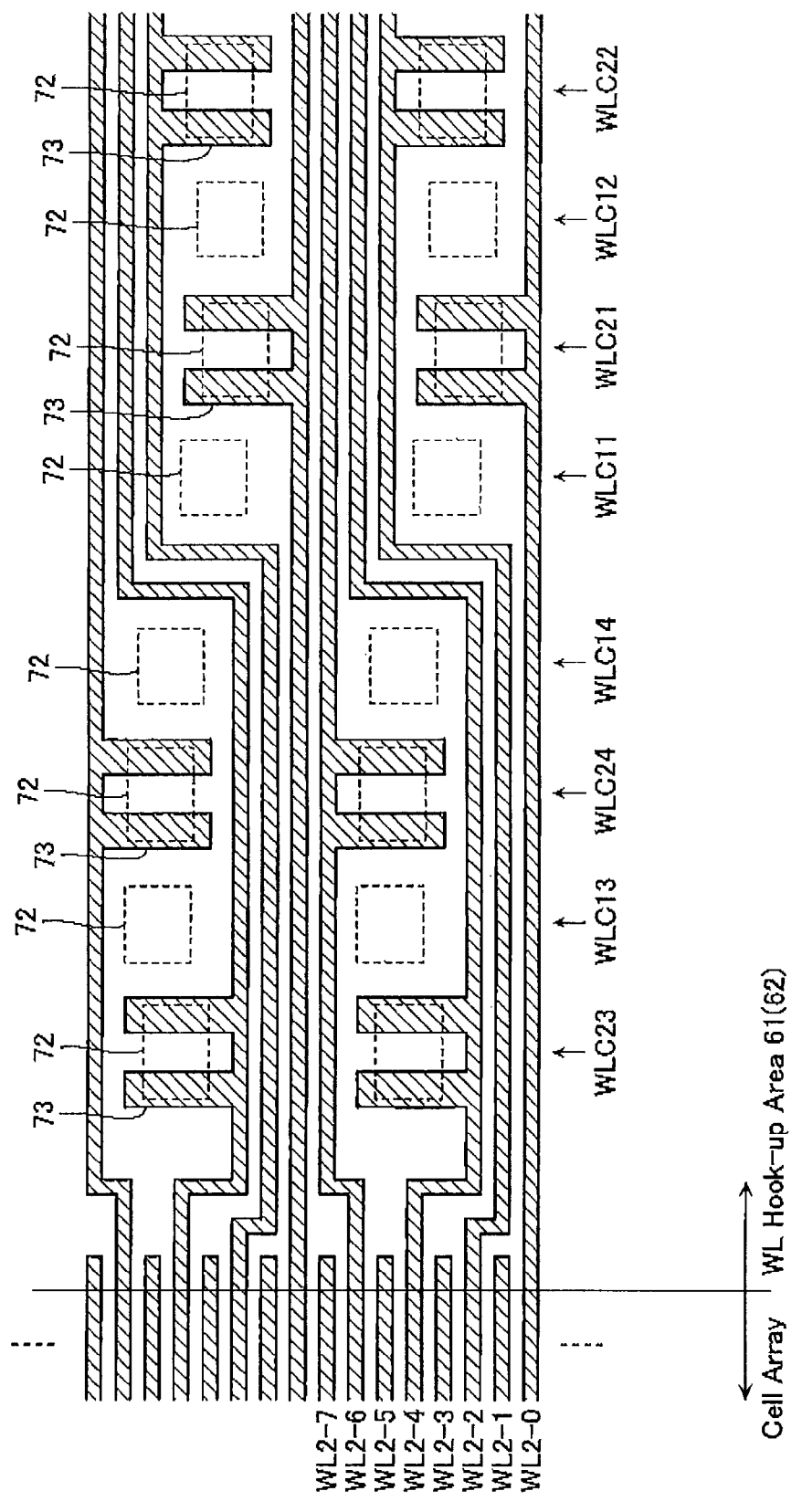
FIG. 36 shows a layout of the word line hook-up portion.

FIG. 36 shows a layout example of the WL hook-up area, in which zia contacts and hook-up portions are arrayed. Shown here is the surface of the second word lines WL2. There are prepared certain spaces among the elongated word lines continued from the cell array area, and hook-up portions 73 are formed and disposed in these spaces.

The layout will be explained in detail below. For example, note that eight word lines WL2-0~WL2-7 in the second layer of word lines WL2. FIG. 32 shows only one word line contact node WLC2 for one word line WL2. In practice, four contact nodes WLC21, WLC22, WLC23 and WLC24 are prepared at intervals of two word lines, and hook-up portions 73 are formed thereabove to be continued to the corresponding word lines. In detail, in the example shown in FIG. 36, hook-up portions 73 of word lines WL2-0, WL2-2, WL2-4 and WL2-6 are formed above word line contact nodes WL21, WL22, WL23 and WL24, respectively.

WL02.

As shown by dotted lines, zia contacts 72 are buried to overlap the hook-up portions 73. Further, zia contacts 72 of the third layer of word lines WL3 are disposed above word line contact nodes WL11, WL12, WL13 and WL14 (corresponding to word line WL1 in FIG. 32) so as to be positioned between the respective zia contacts of word lines WL2. As apparent from FIG. 33, there is contact node WLC1a continued from the word line WL3, which serves as a hook-up portion, on the surface of word line WL3.

Figure 37:
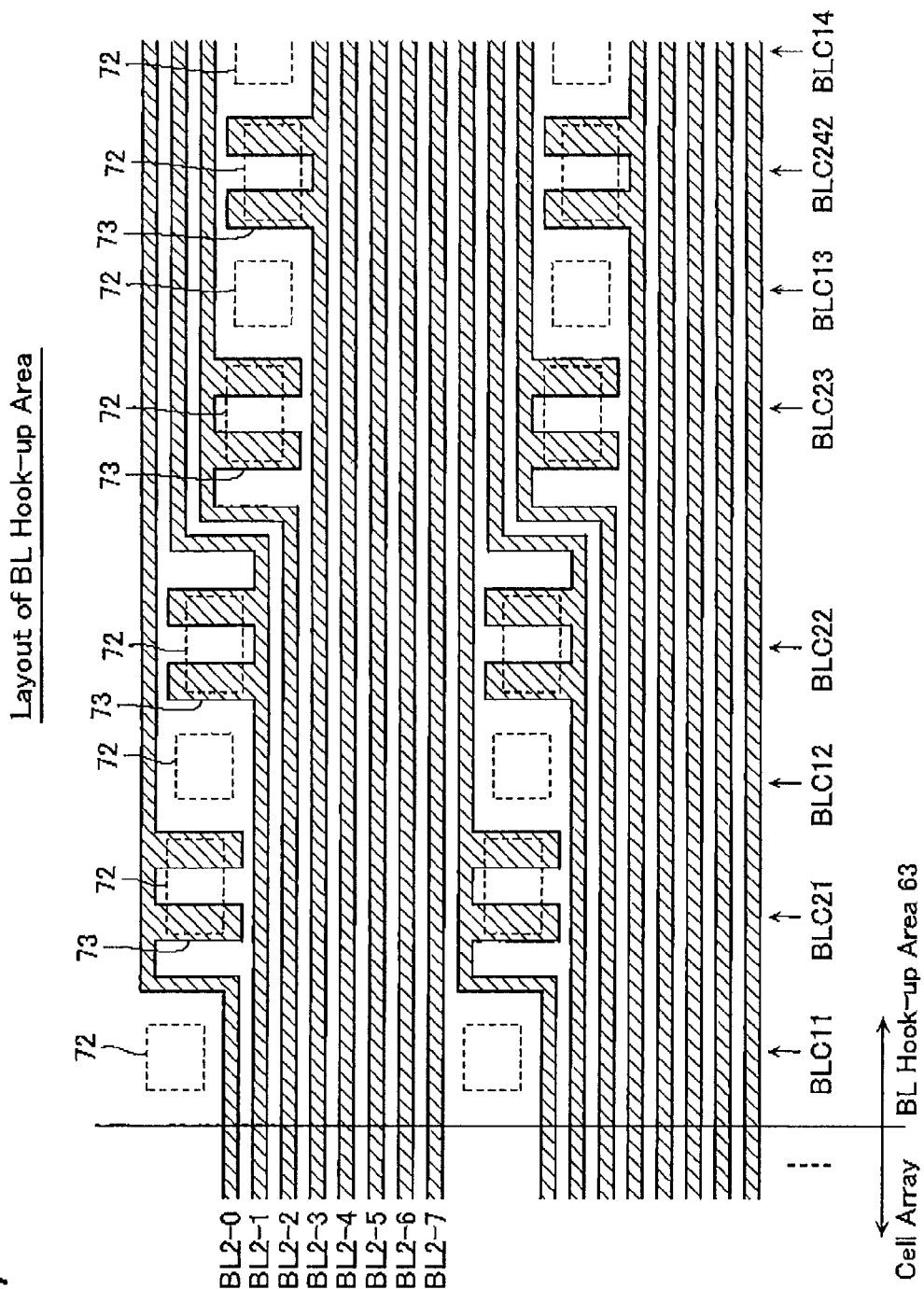
FIG. 37 shows a layout of the bit line hook-up portion.

FIG. 37 shows a layout example of the BL hook-up area, in which zia contacts and hook-up portions are arrayed. Here is shown the surface of the second bit lines BL2. There are prepared certain spaces among the elongated bit lines continued from the cell array area, and hook-up portions 73 are formed and disposed in these spaces.

FIG. 32 shows only one bit line contact node BLC2 for one bit line BL2. In practice, bit line contact nodes BLC21, BLC22, BLC23, BLC24, . . . (to be continued) are prepared for every eight bit lines BL2-0~BL2-7, and hook-up portions 73 are formed thereabove to be continued to the corresponding bit lines. As shown by dotted lines, zia contacts 72 are buried to overlap the hook-up portions 73. Further, zia contacts 72 of the first layer of bit lines BL1 are disposed between these hook-up portions 73. There are prepared no hook-up portions 73 of the first bit lines BL1 on the surface of the second bit lines BL2.

It should be noted that it is in need of securing zia contact areas for the bit lines BL3 and BL4 as similar to the zia contacts for the bit lines BL1.

According to this embodiment described above, a step-shaped zia contact is buried to overlap the metal pieces of a hook-up portion continued to a bit line or a word line. As explained with reference to FIG. 33, zia contact burying process is performed after stacking the plural cell arrays. Therefore, for example, the hook-up portions are different in height from each other between the first bit line (BL1) layer and the second bit line (BL2) layer.

The lower contact area of the zia contact 72 will be defined in principle by the space between two metal pieces 73a and 73b of the hook-up portion 73. For example, notice the bit line BL1 and BL2 with different hook-up heights in FIG. 33. Contact holes for zia contacts 72 are formed to have different depths from each other under the respective hook-up portions, so that contact areas between buried zia contacts 72 and contact nodes BLC1 and BLC2 become different from each other as a result of taper etching. That is, there is generated a large probability that the contact resistances become different from each other therebetween. Explaining in detail, the contact resistance of the second bit line BL2 will be higher than that of the first bit line BL1.

To solve this problem, in this embodiment, it is considered to make the zia contacts have a uniform contact resistance for the respective wiring layers. In detail, as shown in FIG. 38, (a) the first layer of bit line (BL1) hook-up portion 73 and (b) the second layer of bit line (BL2) hook-up portion 73 are set to have different sizes from each other in the bit line direction.

That is, in case metal pieces 73a and 73b are opposed to each other in the bit line direction, metal piece space widths d1 and d2 in the BL1 hook-up portion and BL2 hook-up portion are set to satisfy the following relationship of: d2>d1. In detail, space width, d2, between metal pieces 73a and 73b of the hook-up portion of the second bit line BL2 is larger than that, d1, between metal pieces 73a and 73b of the hook-up portion of the first bit line BL1. On the other hand, the respective metal piece pairs have the same whole width (i.e., total width obtained by adding the space width to the size of both metal pieces) d0; and zia contacts 72 at the respective hook-up portion positions are set to have the same size in the elongated direction (i.e., in the bit line direction). Note here that the BL1 hook-up portion and BL2 hook-up portion, including zia contacts, have the same size as each other in the direction perpendicular to the bit line.

In accordance with this consideration, with respect to the bit line direction, the substantial size of zia contact 72 of the hook-up portion position of the second layer of bit line BL2 is larger than that of the first layer of bit line BL1, and as s result, it becomes possible to achieve a result that the first bit line BL1 and the second bit line BL2 have the same zia contact resistance as each other. Further, keeping the whole width d0 the same as conventional, it becomes possible to prevent the hook-up portion from being increased in area.

Figure 38:
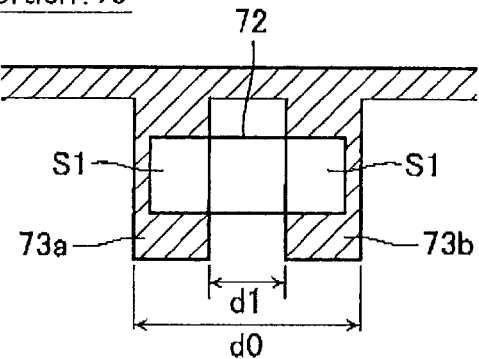
FIG. 38 shows two kinds of bit line hook-up portions.
Figure 38:
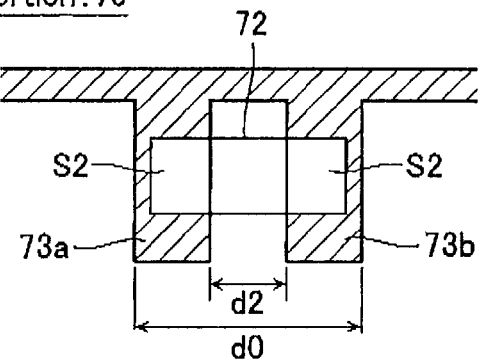

On the other hand, making the metal pieces' space widths different from each other as shown in FIG. 38, over-lap areas (i.e., contact area) between zia contacts and metal piece pairs 73a and 73b become different from each other. That is, the over-lap area on the BL1 hook-up portion 73 is 2S1 while that on the BL2 hook-up portion 73 is 2S2, and 2S1>2S2. Therefore, with respect to the contact resistance of the zia contact for the upper surface of the hook-up portion, the contact resistance of the second bit line BL2 becomes higher than that of the first bit line BL1.

Therefore, it matters that the relationship between space widths d1 and d2 of the hook-up metal pieces should be suitably set in consideration of not only the above-described contact resistance of the lowermost surface of the zia contact but also another contact resistance between the zia contact step and the hook-up metal pieces.

So far, the relationship between the first bit line BL1 and the second bit line BL2 has been explained with reference to FIG. 38. However, as understood from FIG. 33, the relationship between the third bit line BL3 and the fourth bit line BL4 is in the same condition as described above, and it is desired to set suitably the relationship between the hook-up metal spaces. Additionally, without regard to word lines and bit lines, it may be adaptable to suitably set the metal piece space width with respect to three or more wiring layers with different heights.

It is desired to consider the chip size for the layout of hook-up portions and the zia contact arrangement.

Figure 39:
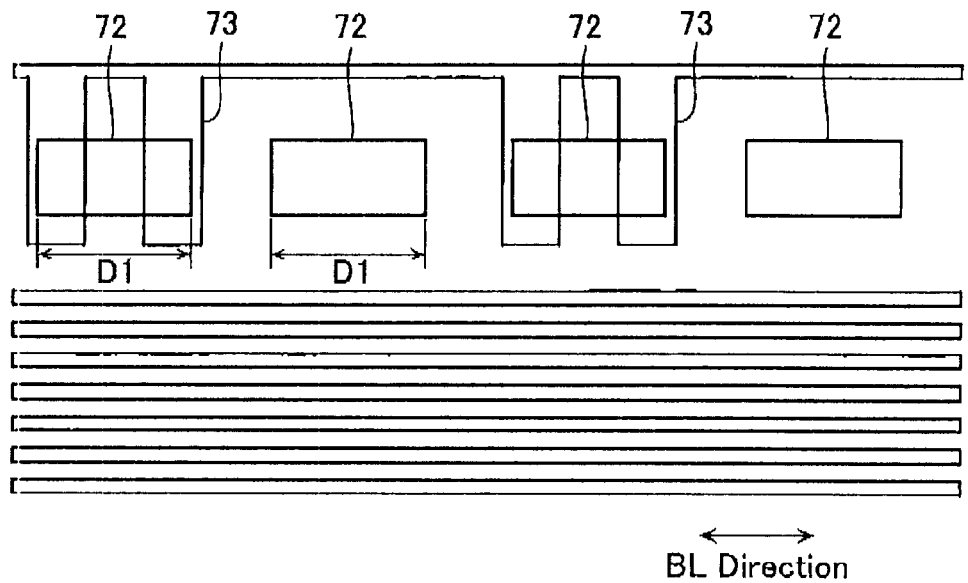
FIG. 39 shows an arrangement pattern the bit line hook-up portions and zia contacts.

For example, FIG. 39 is a layout example of bit line hook-up portions 73 and zia contacts 72. In this example, zia contacts 72 are arranged in the bit line (BL) direction with elongated direction size D1 and at a certain pitch without regard to whether there are hook-up portions or not.

Figure 40:
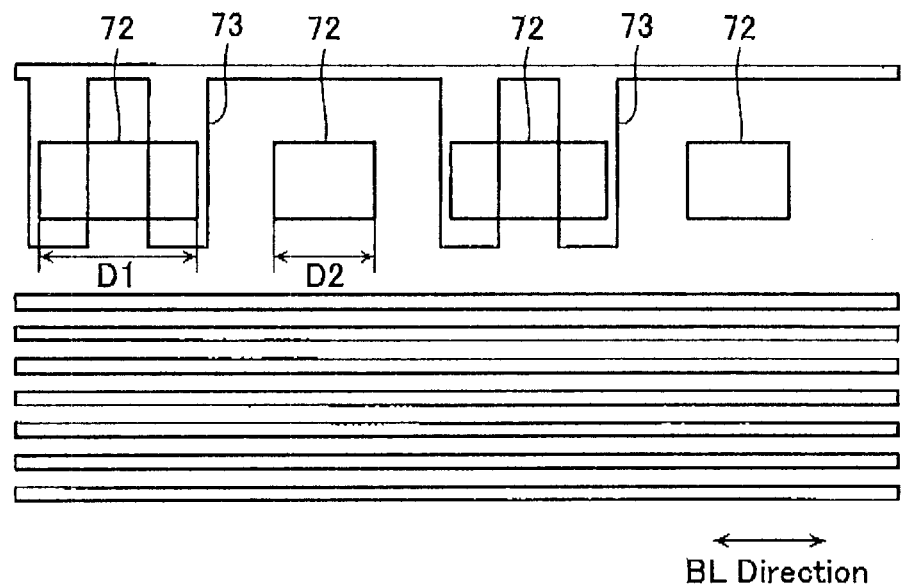
FIG. 40 shows an improved arrangement pattern the bit line hook-up portions and zia contacts.

On the other hand, FIG. 40 shows another example, in which there are prepared two kinds of zia contacts. That is, the zia contact size of the bit line direction (elongated direction) is D1 at the position where the zia contact 72 is overlapped to the hook-up portion 73 while size D2 is smaller than D1 at the position where the hook-up portion is not present (or present at a lower position). In consideration of it, the layout width of the hook-up portions in the bit line direction (i.e., bit line hook-up area width) becomes smaller than that shown in FIG. 39.

FIG. 37 shows another bit line hook-up layout example, in which the same consideration as in FIG. 40 is taken. The zia contact size in the bit line direction at the second bit line BL2 position is set to be larger than that of the zia contact hooked-up at the first bit line BL1 position.

FIG. 39 shows a word line hook-up layout example, in which the same consideration as in FIG. 40 is taken. That is, the zia contact size in the word line direction at the second word line WL2 position is set to be larger than that at the third word line WL3 position without hook-up portions above the word line contact nodes WLC1, WLC2 and the like.

FIG. 42 shows another example of the hook-up portion layout, in which bit line hook-up portion 73 and zia contact 72 are rotated by 90° in comparison with those shown in FIGS. 39 and 40. That is, the pairs of metal pieces 73a ands 73b of the hook-up portion 73 are opposed to each other in the direction perpendicular to the bit line, and the zia contact is elongated in the direction perpendicular to the bit line.

Figure 41:
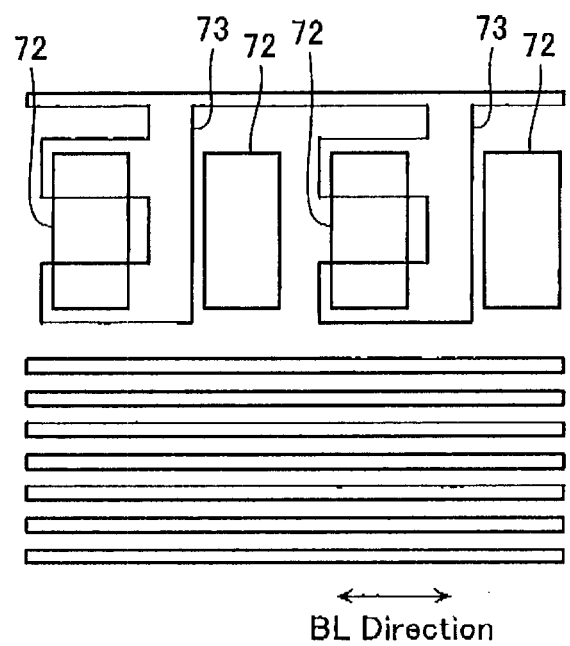
FIG. 41 shows another arrangement pattern the bit line hook-up portions and zia contacts.

In accordance with the layout shown in FIG. 41, it becomes possible to make the bit line hook-up area shrank in width in the bit line direction. Further, it becomes possible to use only one type of zia contacts, and as a result of it, process variations may be suppressed. Additionally in this case, assuming that word line hook-up portions are arrayed in accordance with the manner shown in FIG. 39, zia contact elongated directions are the same as each other between the bit line hook-up area and the word line hook-up area. Therefore, the process variations may be suppressed more.

In the three-dimensionally stacked cell array, the lower the cell array layer becomes, the greater the influence of the process history. Therefore, the wiring resistances are often different from each other between two wiring layers. In this case, it is effective to make the hook-up portions have different spaces of the metal pieces from each other in the two wiring layers so as to set these wiring resistances to be substantially the same. In detail, in case the lower wiring resistance is higher than the upper wiring resistance as a result of the heat history, to make the contact resistance of the zia contact of the lower wiring layer lower than that of the upper wiring layer, the space of the metal pieces in the hook-up portion in the lower wiring layer is set to be larger than that in the upper wiring layer. By contrast, in case the lower wiring resistance is lower than the upper wiring resistance, the space of the metal pieces in the hook-up portion in the lower wiring layer is set to be smaller than that in the upper wiring layer.

Further, in case there are prepared plural zia contacts in a certain wiring layer, it is also effective to make the zia contacts have different spaces of the metal pieces from each other in at least two zia contacts. As a result, the wiring resistance differences between the respective zia contacts and the corresponding cells may be suppressed.

This invention is not limited to the above-described embodiment. It will be understood by those skilled in the art that various changes in form and detail may be made without departing from the spirit, scope, and teaching of the invention.

What is claimed is:
1. A semiconductor integrated circuit device comprising:
a semiconductor substrate;
multiple wiring layers stacked on the semiconductor substrate with interlayer insulating films interposed therebetween;

wiring hook-up portions extended from the corresponding wirings in the respective wiring layers;

contact conductors so buried in the interlayer insulating films as to pass through the wiring hook-up portions for vertically leading wirings of the respective wiring layers; and multiple cell array layers; wherein the wiring hook-up portions have different sizes from each other between at least two layers in the wiring layers;

word lines and bit lines, which cross each other, are alternately stacked to constitute the multiple wiring layers;

as the wiring hook-up portions, word line hook-up portions and bit line hook-up portions are disposed in a word line hook-up area and a bit line hook-up area, respectively;

in the multiple cell array layers, nonvolatile memory cells are arranged at cross-points between the adjacent bit lines and word lines; and the nonvolatile memory cells are resistance charge type ones, in each of which a variable resistance element and a diode are connected in series.

2. The semiconductor integrated circuit device according to claim 1, wherein each of the wiring hook-up portions is a pair of metal pieces opposed to each other with a certain space, widths of the spaces being different from each other between at least two layers in the wiring layers, and wherein the contact conductors are buried through the spaces of the hook-up portions.

3. The semiconductor integrated circuit device according to claim 2, wherein between the pairs of metal pieces having the spaces with different widths, the total width of one of the pairs of metal pieces is the same as the other pair while the metal width of one of the pairs of metal pieces is different from that of the other pair.

4. The semiconductor integrated circuit device according to claim 2, wherein the pairs of metal pieces of the wiring hook-up portions are disposed to be opposed to each other in the direction of the wirings.

5. The semiconductor integrated circuit device according to claim 2, wherein the pairs of metal pieces of the wiring hook-up portions are disposed to be opposed to each other in the direction perpendicular to the wirings.

6. The semiconductor integrated circuit device according to claim 1, wherein each of the contact conductors includes at least two metal layers buried in the lower potion and the upper portion of the interlayer insulating films to be stacked.

* * * * *

UNITED STATES PATENT AND TRADEMARK OFFICE
CERTIFICATE OF CORRECTION

PATENT NO. : 8,274,068 B2
APPLICATION NO. : 12/727807
DATED : September 25, 2012
INVENTOR(S) : Hiroyuki Nagashima It is certified that error appears in the above-identified patent and that said Letters Patent is hereby corrected as shown below:

Claim 1, line 19, change "the nonvolatile memory cells are resistance charge type ones," to --the nonvolatile memory cells are resistance change type ones,--.

Signed and Sealed this
Eighteenth Day of December, 2012

David J. Kappos
*Director of the United States Patent and Trademark Office*

UNITED STATES PATENT AND TRADEMARK OFFICE
CERTIFICATE OF CORRECTION

PATENT NO. : 8,274,068 B2  
APPLICATION NO. : 12/727807  
DATED : September 25, 2012  
INVENTOR(S) : Hiroyuki Nagashima Page 1 of 1

It is certified that error appears in the above-identified patent and that said Letters Patent is hereby corrected as shown below:

Column 19, lines 19 and 20 (Claim 1, lines 23 and 24), change "the nonvolatile memory cells are resistance charge type ones," to --the nonvolatile memory cells are resistance change type ones,--.

This certificate supersedes the Certificate of Correction issued December 18, 2012.

Signed and Sealed this  
Nineteenth Day of February, 2013

Teresa Stanek Rea  
*Acting Director of the United States Patent and Trademark Office*